United States Patent
Girdhar et al.

(10) Patent No.: US 8,362,555 B2
(45) Date of Patent: Jan. 29, 2013

(54) VOLTAGE CONVERTER AND SYSTEMS INCLUDING SAME

(75) Inventors: Dev Alok Girdhar, Indialantic, FL (US); Francois Hebert, San Mateo, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/796,178

(22) Filed: Jun. 8, 2010

(65) Prior Publication Data

US 2011/0121808 A1    May 26, 2011

Related U.S. Application Data

(60) Provisional application No. 61/263,919, filed on Nov. 24, 2009.

(51) Int. Cl.
*H01L 29/66* (2006.01)
(52) U.S. Cl. .................. 257/337; 257/E21.619; 438/275
(58) Field of Classification Search ........... 257/E21.619, 257/337; 438/275
See application file for complete search history.

(56) References Cited

U.S. PATENT DOCUMENTS

| | | | |
|---|---|---|---|
| 2006/0231904 A1* | 10/2006 | Kocon | 257/391 |
| 2009/0159928 A1 | 6/2009 | Madathil et al. | |
| 2010/0008175 A1* | 1/2010 | Sweere et al. | 365/229 |

FOREIGN PATENT DOCUMENTS

KR        0137108        6/1998

OTHER PUBLICATIONS

10A High Efficiency DC/DC µModule, Linear Technology LTM4600, 24 pgs.
Korean Patent Office, "Office Action", Apr. 24, 2012, Published in: KR.

* cited by examiner

*Primary Examiner* — Kimberly Rizkallah
*Assistant Examiner* — Marvin Payen
(74) *Attorney, Agent, or Firm* — Fogg & Powers LLC

(57) ABSTRACT

A voltage converter includes an output circuit having a high side device and a low side device which can be formed on a single die (i.e. a "PowerDie") and connected to each other through a semiconductor substrate. Both the high side device and the low side device can include lateral diffused metal oxide semiconductor (LDMOS) transistors. Because both output transistors include the same type of transistors, the two devices can be formed simultaneously, thereby reducing the number of photomasks over other voltage converter designs. The voltage converter can further include a controller circuit on a different die which can be electrically coupled to, and co-packaged with, the PowerDie.

21 Claims, 19 Drawing Sheets

VOLTAGE CONVERTER AND SYSTEMS INCLUDING SAME

CROSS-REFERENCE TO RELATED APPLICATION

This application claims benefit of provisional U.S. Patent Application Ser. No. 61/263,919 filed Nov. 24, 2009, which is incorporated herein by reference in its entirety. This application is also related to U.S. Provisional Application 61/140,610 filed Dec. 23, 2008, to provisional U.S. Patent Application Ser. No. 61/162,232 filed Mar. 20, 2009, to U.S. patent application Ser. No. 12/470,229, filed May 21, 2009, to U.S. patent application Ser. No. 12/471,911, filed May 26, 2009, and to U.S. patent application Ser. No. 12/477,818, filed Jun. 3, 2009, the disclosures of which are incorporated herein by reference.

DESCRIPTION OF THE EMBODIMENTS

Reference below is made in detail to exemplary embodiments of the present teachings, examples of which are illustrated in the accompanying drawings. Wherever possible, the same reference numbers will be used throughout the drawings to refer to the same or like parts. The accompanying drawings, which are incorporated in and constitute a part of this specification, illustrate embodiments of the invention and together with the description, serve to explain the principles of the invention. In the figures.

It should be noted that some details of the FIGS. have been simplified and are drawn to facilitate understanding of the inventive embodiments rather than to maintain strict structural accuracy, detail, and scale.

Figure 1:
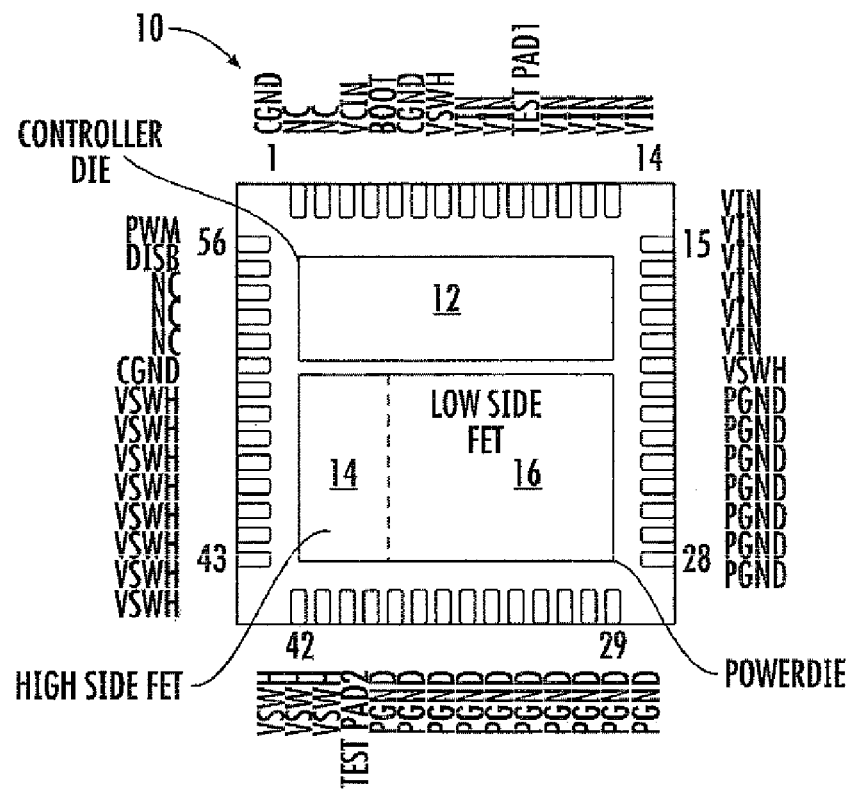
FIG. 1 is a bottom view of a power converter device in accordance with an embodiment of the invention.
Figure 2:
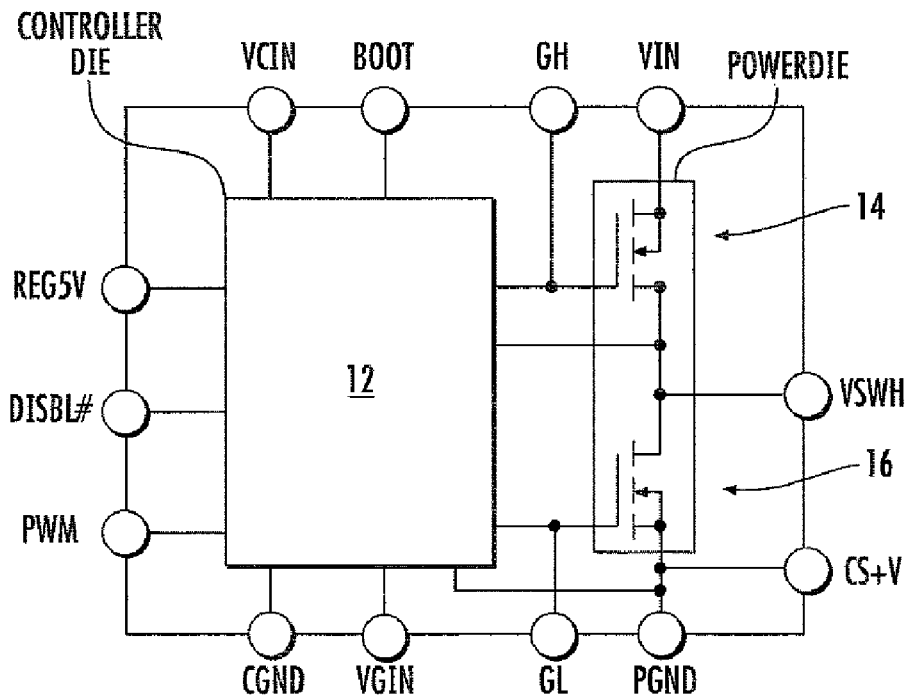
FIG. 2 is a block diagram of an embodiment of a voltage converter device including low side and high side output power devices on a single die.

FIG. 1 depicts a semiconductor device 10 in accordance with an embodiment of the present teachings. FIG. 1 depicts at least a portion of a direct current (DC) to DC converter with co-packaged semiconductor dies including a first die with control circuitry 12 (i.e. a controller) which can provide a controller metal oxide semiconductor field effect transistor integrated circuit (MOSFET IC). FIG. 1 further depicts a second MOSFET die including one or more high side circuit device 14 (i.e. high side circuitry) and one or more low side circuit device 16 (i.e. low side circuitry) on a single semiconductor die, such as a single piece of silicon, gallium arsenide, or other semiconductor material. A block diagram of a DC to DC converter device is depicted in FIG. 2, which also depicts controller circuitry 12, high side circuitry 14 connected to a $V_{IN}$ pinout and adapted to be electrically coupled with $V_{IN}$ during device operation, and low side circuitry 16 connected to a power ground ($P_{GND}$) pinout and adapted to be electrically coupled with $P_{GND}$ during device operation. The interconnection between the high side device 14 and the low side device 16 between $V_{IN}$ and $P_{GND}$ is referred to as a "half bridge." A semiconductor device voltage converter in accordance with an embodiment of the invention can include the package pinouts and pin assignments such as those depicted in the FIGS.

Examples of devices which can be formed in accordance with the present teachings include, but are not limited to, a non-synchronous buck DC to DC converter (i.e. "non-synch buck" converter) with co-packaged high side MOSFET and external Schottky diode, a non-synch buck DC to DC converter with co-packaged high side and low side MOSFETs, a synchronous buck DC to DC converter with co-packaged high side and low side MOSFETs, a boost DC to DC converter with co-packaged MOSFETs (synchronous boost), and a boost DC to DC converter with co-packaged MOSFET and Schottky diodes, among others.

A device design incorporating a single die including both a low side device and high side device on a single die is referred to herein as a "PowerDie." A PowerDie can include both a high side power transistor and a low side power transistor on a single piece of silicon or other semiconductor substrate. One type of PowerDie is disclosed in co-pending U.S. patent application Ser. No. 12/470,229, filed May 21, 2009 and titled "Co-Packaging Approach for Power Converters Based on Planar Devices, Structure and Method." This application, commonly assigned with the present application and incorporated herein by reference, describes the use of a PowerDie along with a controller IC having controller circuitry on a separate die which can be packaged separately and placed on a supporting substrate such as a printed circuit board (PCB), or which can be co-packaged as two separate dies into a single semiconductor device, such as an encapsulated semiconductor device. The platform of the PowerDie referenced in the incorporated application can integrate a trench field effect transistor (FET) acting as a low side FET and a lateral FET with a deep trench side acting as a high side FET.

The teachings of the present disclosure below describe a PowerDie which can include various power output converting structures and attributes. This implementation of a PowerDie can employ the use of lateral FETs as transistors for both the low side and the high side devices. Also, a drain of the low side FET can be connected to a source of the high side FET through a semiconductor substrate and a deep trench metal. Additionally, a process to form the device may include a reduced number of masks by using the same process features for both high side and low side FETs. The resulting device may provide improved performance at higher switching frequencies, which can result from a reduced gate charge for the low side FET. Because of a reduced $R_{ON}*Q$ figure of merit, the device may have reduced power losses at high switching frequencies (e.g. frequencies ≧about 700 kHz), a high duty cycle application (e.g. a $V_{OUT}$ of about $0.5*V_{IN}$), and a low current application (e.g. an operating current less than about 1.0 A). A device in accordance with the present teachings can be tailored for any voltage rating, particularly in the about 5 V to about 100 V, for example about 30 volts.

It will be understood that the embodiments below describe the formation of two lateral N-channel diffusion metal oxide semiconductor (NDMOS) devices at separate locations on the same piece of silicon or other semiconductor substrate, but it will be recognized that the description can be modified to form two lateral PDMOS devices. The devices can be formed at locations on the die which are remote from each other as represented below and in the FIGS., or the devices can be adjacent to each other. Further, because a method of the present teachings is described in reference to the formation of two lateral NDMOS devices, the body region (for example) is described as a P-body region (i.e. a P-type body region), while this structure will be an N-body region for a lateral PDMOS device, and is referred to generically as a "body region." Additionally, the "P-buried layer" (PBL) is referred to generically as a "buried layer."

Figure 3A:
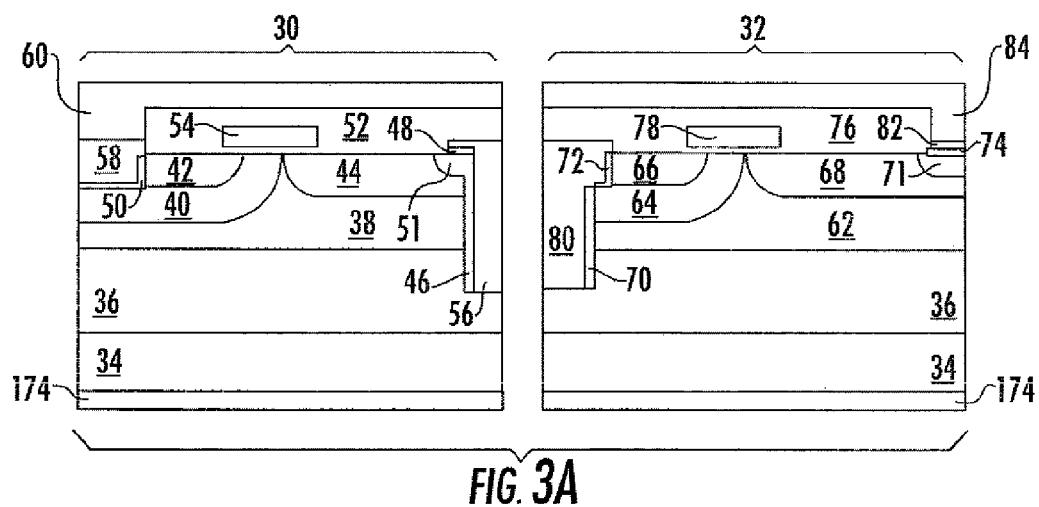
FIGS. 3-7 are cross sections depicting various embodiments in accordance with the present teachings.
Figure 3B:
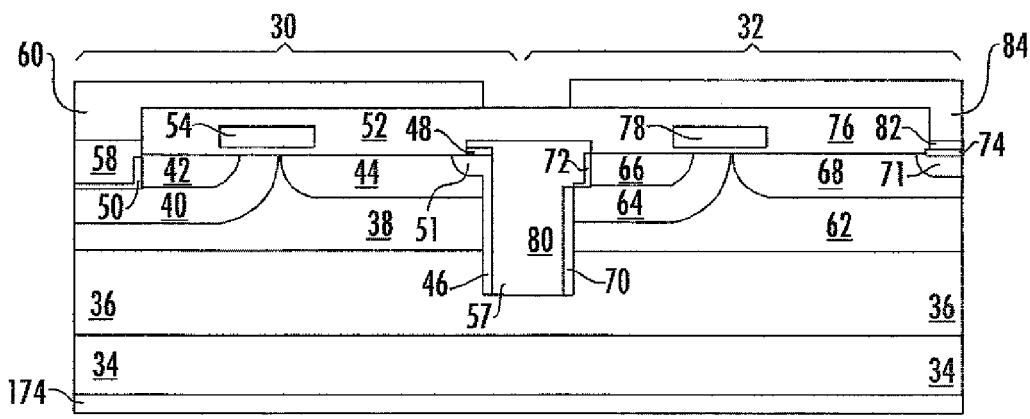

FIG. 3A depicts an embodiment of the present teachings, which can include devices formed to provide a PowerDie. As depicted in FIG. 3A, the PowerDie includes a low side FET 30 as a low side circuit device and a high side FET 32 as a high side circuit device. The low side FET 30 and the high side FET 32 are depicted as being separated to emphasize that they can be formed at separate locations on a single semiconductor substrate (such as a silicon semiconductor wafer) and, during use, can reside at separate locations on a single semiconductor die. However, they can also be formed adjacent to each other such that, for example, trench conductor 56 and trench conductor 80 (described below) in FIG. 3A are the same structure. This alternate embodiment is depicted in FIG. 3B, wherein FETs 30, 32 are formed adjacent to each other with a trench conductor 57 interposed between the two FETs.

The low side FET 30 can include, for example: a semiconductor substrate 34 doped to an N+ conductivity and having a doping concentration of about 1E18 to about 1E20 atoms/cm$^3$; a grown, deposited, or attached epitaxial semiconductor layer 36 doped to an N-type conductivity having a doping concentration of about 1E14 to about 1E18 atoms/cm$^3$, but lower than the doping concentration of the N+ semiconductor substrate; a P-doped buried layer (also referred to herein as a "P-buried layer" or "PBL") 38 having a doping concentration of about 1E15 to about 1E18 atoms/cm$^3$; a P-body region 40 doped to a P-type conductivity having a doping concentration of about 1E16 to about 1E18 atoms/cm$^3$; an N+ source region 42 having a doping concentration of about 1E18 to about 5E20 atoms/cm$^3$; an N-drift region 44 having a doping concentration of about 1E14 to about 1E17 atoms/cm$^3$; an N+ doped isolation region 46 having a doping concentration of about 1E18 to about 5E20 atoms/cm$^3$; silicide structures 48, 50; an N+ doped drain region 51 having a doping concentration of about 1E18 to about 5E20 atoms/cm$^3$; dielectric 52; a conductive gate 54; a conductive layer which forms a trench conductor 56 and a source contact 58; and a conductive source metal 60.

The high side device 32 can include, for example: the semiconductor substrate 34 doped to the N+ conductivity to doping concentration of about 1E18 to about 1E20 atoms/cm$^3$; the grown, deposited, or attached epitaxial semiconductor layer 36 doped to an N-type conductivity to a doping concentration of about 1E14 to about 1E18 atoms/cm$^3$, but lower than the N+ doping concentration of the N+ semiconductor substrate; a P-doped buried layer 62 (also referred to herein as a "P-buried layer" or "PBL") having a doping concentration of about 1E15 to about 1E18 atoms/cm$^3$; a P-body region 64 doped to a P-type conductivity and having a doping concentration of about 1E16 to about 1E18 atoms/cm$^3$; an N+ source region 66 having a doping concentration of about 1E18 to about 5E20 atoms/cm$^3$; an N-drift region 68 having a doping concentration of about 1E14 to about 1E17 atoms/cm$^3$; an N+ doped isolation region 70 having a doping concentration of about 1E18 to about 5E20 atoms/cm$^3$; an N+ doped drain region 71 having a doping concentration of about 1E18 to about 5E20 atoms/cm$^3$; silicide structures 72, 74; dielectric 76; a conductive gate 78; a conductive layer which forms a trench conductor 80 and a source contact 82; and a conductive drain metal 84.

It will be noted that various structures for the low side FET 30 and the high side FET 32 can be formed from the same implant or layer as discussed below and will thus have the same dopant concentration, but may be numbered differently for ease of explanation.

The N+ isolation regions 46, 70 can be formed by ion implantation into the sidewalls of the trenches to isolate trench conductors 56, 80 from the P-buried layers 38, 62 respectively. The low side device drain region 51 is electrically coupled to the trench conductor 56 through silicide structure 48, and the trench conductor 56 electrically couples the low side device drain region 51 to the N+ semiconductor substrate 34 through the N-type epitaxial semiconductor layer 36. The high side device source region 66 is electrically coupled to the trench conductor 80 through silicide structure 72, and the trench conductor 80 electrically couples the high side device source region 66 to the N+ semiconductor substrate 34 through the N-type epitaxial semiconductor layer 36. Thus the low side drain region 51 is electrically connected to the high side source region 66. The conductive source metal 60 can be electrically coupled with a device ground ($P_{GND}$) pinout, while the conductive drain metal 84 can be electrically coupled with a voltage in ($V_{IN}$) pinout, for example in accordance with the circuit schematic of FIG. 2. The lower surface of the substrate (the bottom of layer 34) can be contacted, for example with a conductive layer 174 such as a metal layer, to supply the output of the device.

Figure 14:
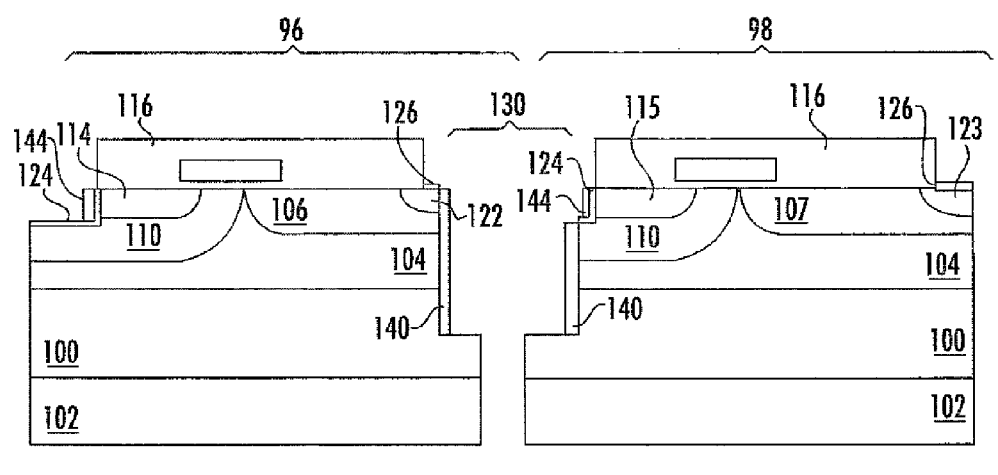
Figure 15:
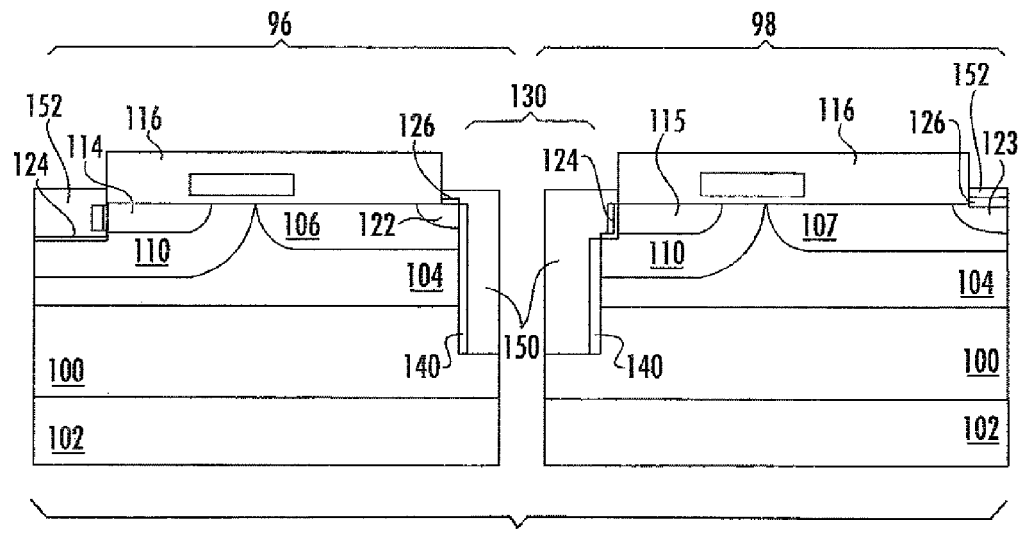
Figure 16:
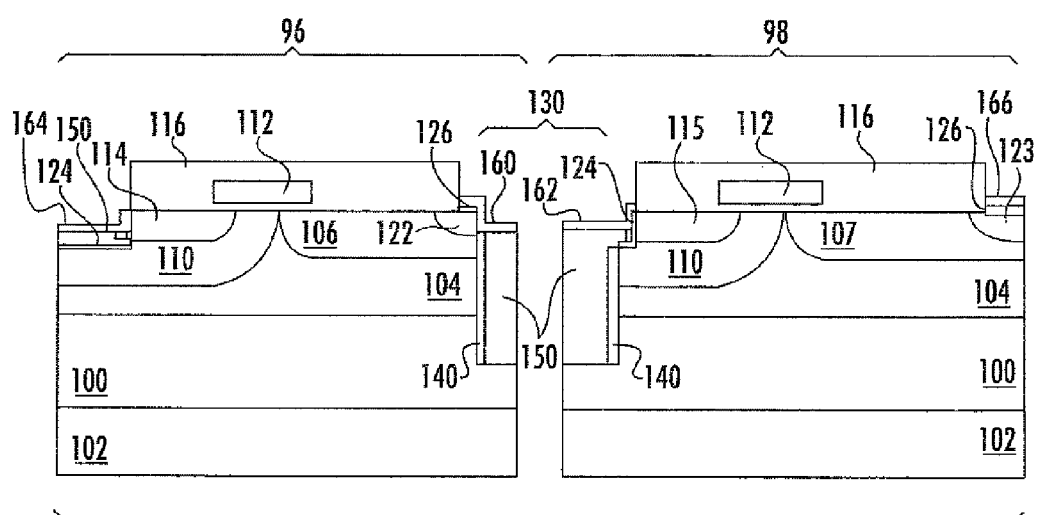

A method for forming the structure of FIG. 3 will be evident from the methods and structures depicted and described below, for example a method similar to that depicted in FIGS. 8-17. An alternate embodiment is depicted in FIG. 16, which is described in the text below. Additionally, the function of each structure will become apparent from the following description and the accompanying depictions.

Both the low side FET 30 and the high side FET 32 can be formed during a single process which simultaneously forms similar layers on each device. For example, the low side P-body region 40 and the high side P-body region 64 can be simultaneously implanted during a single doping sequence. Similarly, a source implant can form the source 42 of the low side device and the source 66 of the high side device.

Figure 4:
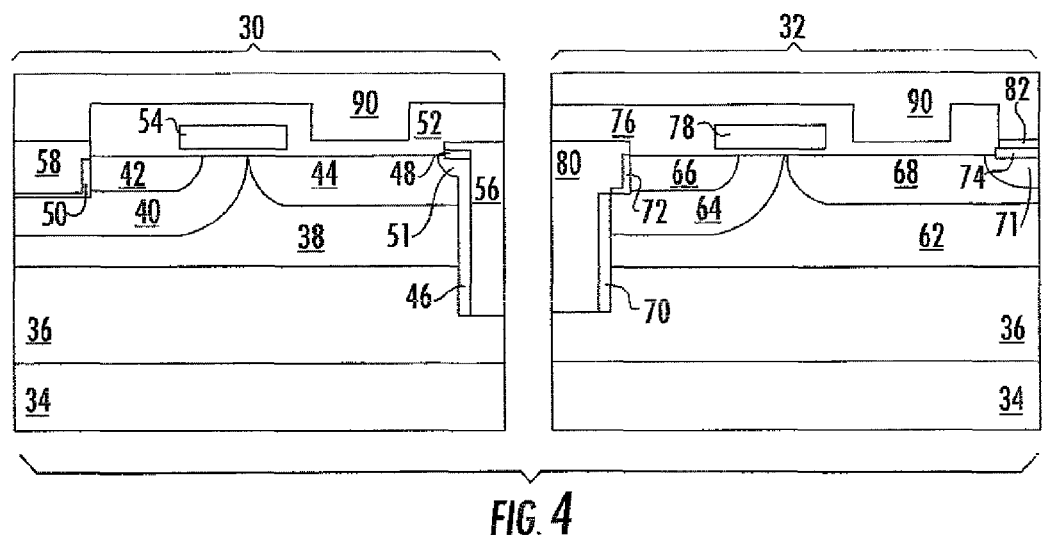

FIG. 4 depicts an embodiment similar to that of FIG. 3, except that dielectric 52 surrounding the low side conductive gate 54 and high side conductive gate 78 is graded (stepped) by the overlying metal layer 90. That is, the dielectric surrounding each gate is not planar across an upper surface as depicted in FIG. 3, but rather the metal 90 overlying the dielectric 52, 76 extends down into an opening in the dielectric. The embodiment of FIG. 4 can thus include both a trench with an N+ sidewall 46 on the low side and graded dielectric 52, 76 such as a graded oxide.

The FIG. 4 structure may result in a more desirable on-resistance ($RDS_{ON}$) vs. breakdown voltage trade-off than the FIG. 3 structure, such that improved performance can be achieved. For a typical power device, $RDS_{ON}$ increases with increasing breakdown voltage. However, the rate at which this voltage increases can be different for different device types. It is preferred to minimize $RDS_{ON}$ for a given voltage or voltage range. A device can be configured so that for a given voltage or voltage range, the $RDS_{ON}$ is lower for that voltage or voltage range. The device with lower $RDS_{ON}$ in a given voltage or voltage range is said to have a more desirable $RDS_{ON}$ vs. breakdown voltage trade-off.

Figure 5:
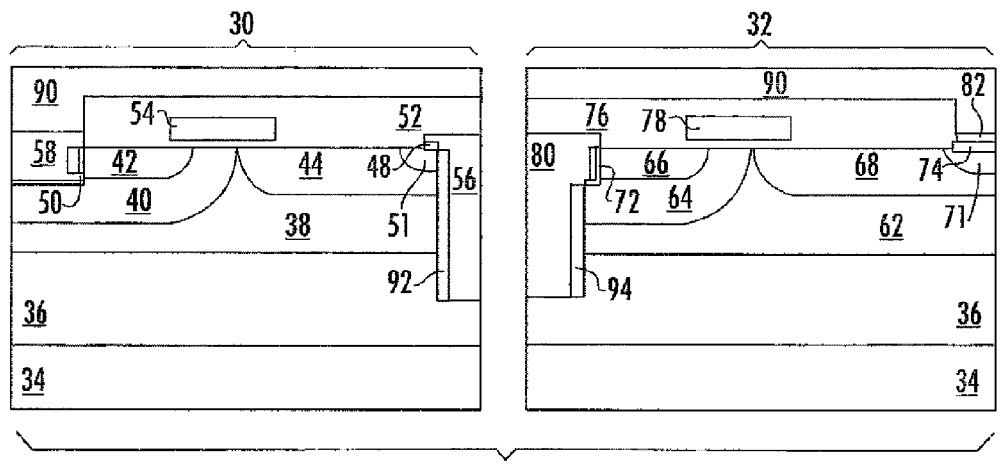

The FIG. 5 structure includes structures similar to that of FIG. 3 and additionally includes a first dielectric liner 92 on the trench sidewall of the low side FET and a second dielectric liner 94 on the trench sidewall of the high side FET. Using dielectric liners 92, 94 such as silicon dioxide as depicted in FIG. 5 rather than the implanted N+ sidewalls 46, 70 such as those depicted of FIG. 3 may provide improved device isolation and reduced process complexity in some uses.

Figure 6:
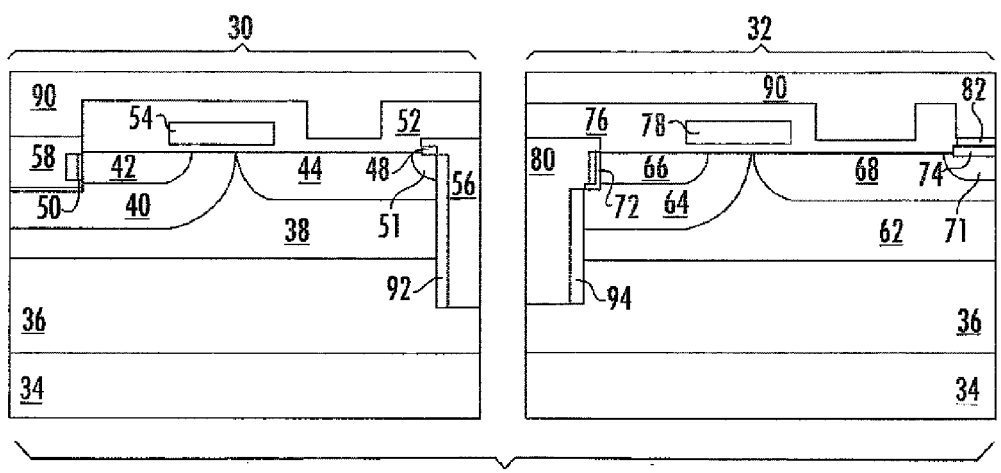

The FIG. 6 structure combines the dielectric liners 92, 94 such as those depicted in the FIG. 5 structure along with a graded (stepped) dielectric 90 such as that depicted in FIG. 4 which surrounds the conductive FET gates 54, 78.

Figure 7:
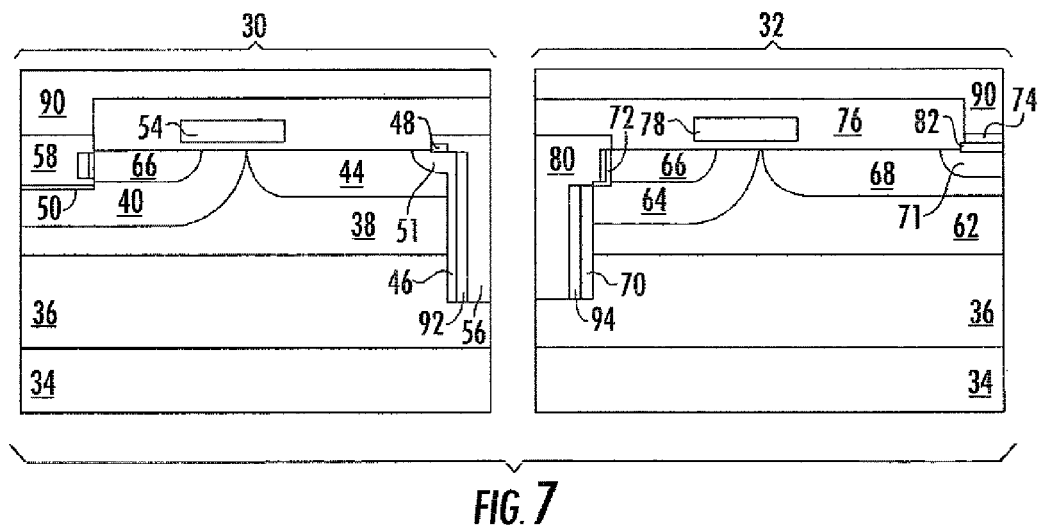

The FIG. 7 structure includes both dielectric liners 92, 94 along the sidewalls of the trenches such as those depicted in FIG. 5 and N+ implanted regions 46, 70 similar to those depicted in FIG. 3 which are adjacent to the dielectric liners. Including both implanted isolation and dielectric liners as insulation may result in improved electrical isolation.

FIGS. 8-17 are cross sections of intermediate structures which can be formed in accordance with one or more embodiments of the present teachings. It will be understood by one of ordinary skill in the art that modification of the processes can result in any of the devices depicted in FIGS. 3-7, 16, and 17.

Figure 8:
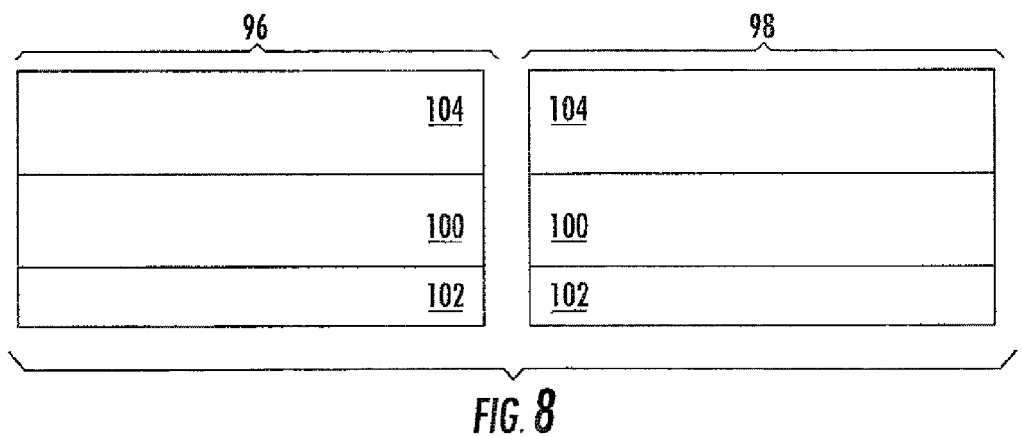
FIGS. 8-17 are cross sections of intermediate structures which can be formed in accordance with one or more embodiments of the present teachings.

An embodiment of a process which will result in the formation of a low side FET 96 at a first wafer location and a high side FET 98 at a second wafer location can begin with the manufacture of the FIG. 8 structure which can be formed using various methods. For example, an N-type epitaxial layer 100 can be formed on an N+ semiconductor substrate 102, followed by the formation of a P-type epitaxial layer 104 doped to a P− conductivity (which will provide a PBL) on the N-type epitaxial layer 100.

In an alternate process, an N-type epitaxial layer can be formed on an N+ semiconductor substrate, and then the N-type epitaxial layer is counterdoped at an upper region to provide a net P-type conductivity to a P− level to form what will be the PBL, to provide a similar structure to that depicted in FIG. 8.

Subsequently, an active region can be defined at another wafer location, for example by a localized oxidation of silicon (LOCOS) process, then patterned N-drift regions 106, 107 are implanted into the P-buried layers 104 for the low side 96 and high side 98 devices respectively, for example using a photolithographic process, to result in the FIG. 9 structure. Even though the N-drift regions can be implanted simultaneously using a single processing sequence, the N-drift region 106 of the low side device 96 has been numbered differently from the N-drift region 107 of the high side device 98 for descriptive clarity.

Figure 9:
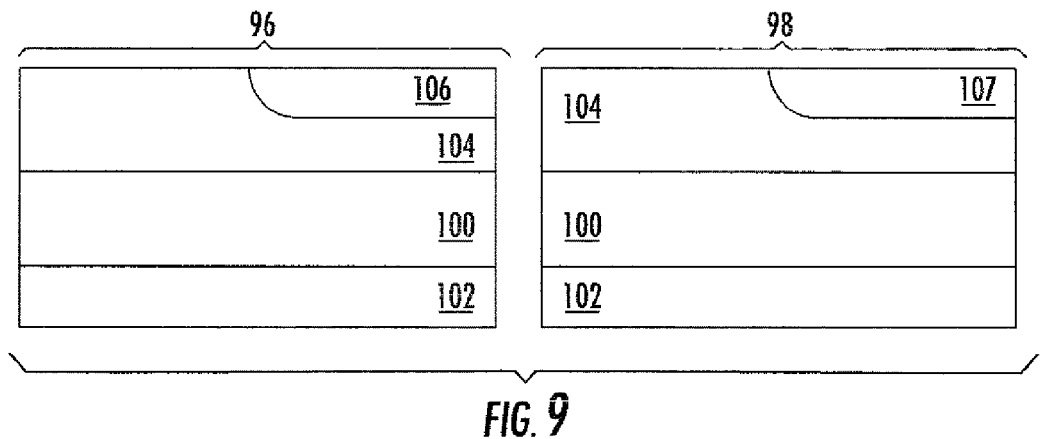
Figure 10:
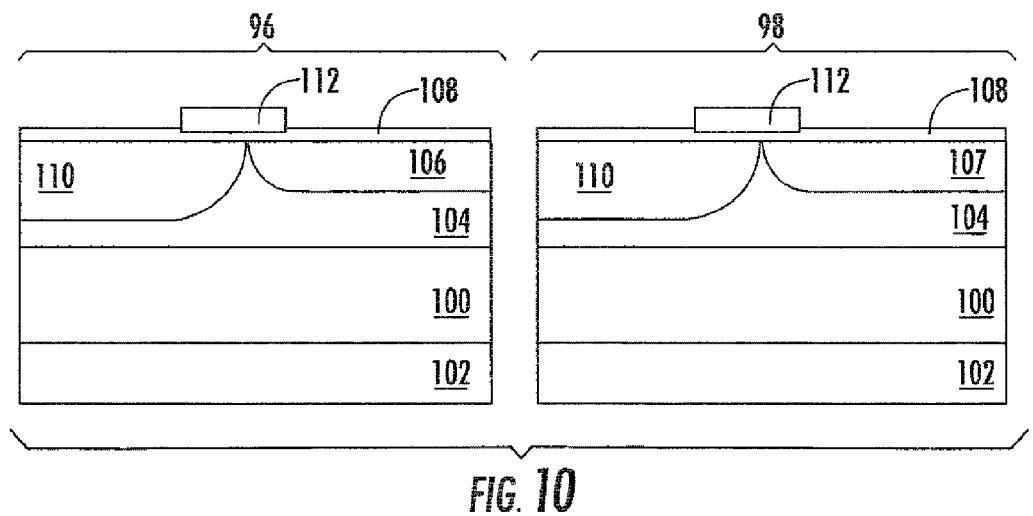

Processing on the FIG. 9 structure can continue with a growth of transistor gate dielectric 108 such as a high quality oxide, patterning and doping of a P-body region 110 for both the low side FET 96 and the high side FET 98, and patterning and doping of the low side and high side transistor gates 112, for example using a photoresist and one or more ion implantation sequences in accordance with known techniques to result in the FIG. 10 structure. The transistor gates can be formed from a deposited layer, for example polysilicon, that is patterned after deposition. Gate polysilicon can be doped during deposition (i.e. in situ doped) or doped in a separate implantation after deposition, or both. If made from a highly conductive material such as metal, the transistor gates can remain undoped. In another embodiment, the transistor gates 112 can be formed prior to implanting the P-body regions 110, in which case the P-type implant to form the P-body regions 110 will be self-aligned through blocking of the implant by the transistor gates 112 and non-active regions.

Next, patterned N+ source regions 114, 115 can be implanted for the low side FET 96 and the high side FET 98 respectively. In an alternate embodiment, the N+ drain regions 122, 123 for the low side and high side FETs, discussed below, can be implanted using the source mask which defines the N+ source regions 114, 115. An interlevel dielectric (ILD) layer, for example an oxide material, is formed over the gate dielectric layer and over the transistor gates 112 to result in the FIG. 11. Dielectric layer 116 thus includes both an ILD layer and the gate dielectric oxide 108 of FIG. 10.

Figure 11:
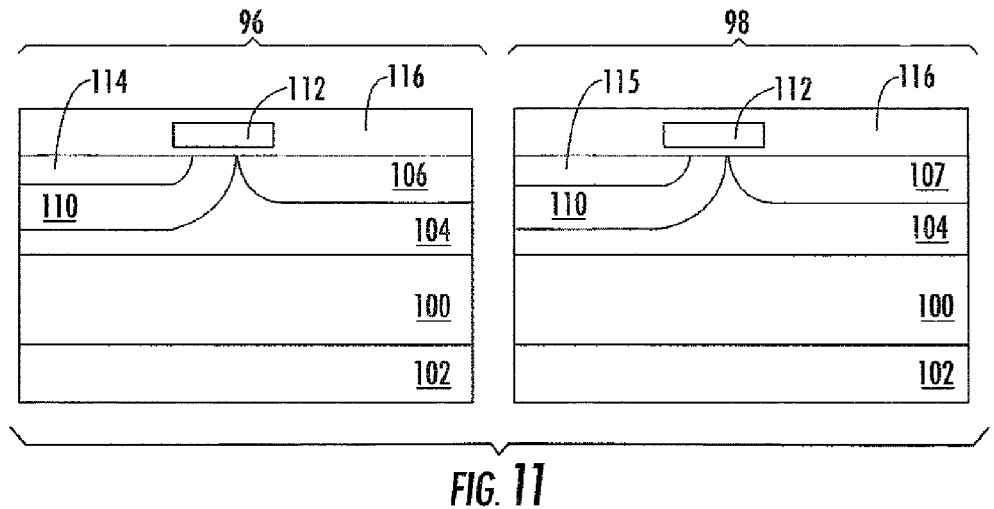
Figure 12:
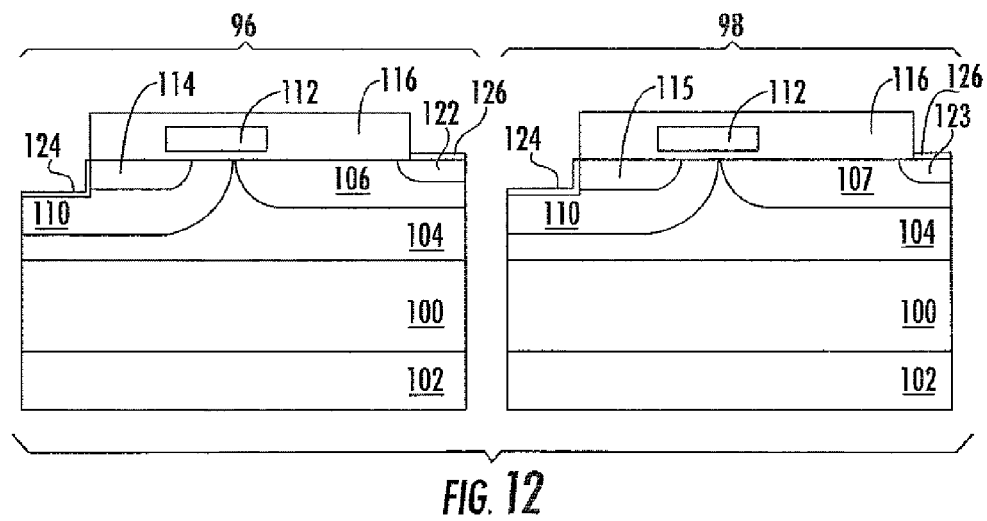

The FIG. 11 structure can then be processed using a photomask to cover the low side device 96 and the high side device 98, except for a portion of the N-drift regions 106, 107 which are left unmasked (uncovered). The dielectric 116 is etched from over the N-drift regions 106, 107, the mask is removed, then an N+ implant is performed to form the low side FET drain region 122 and the high side FET drain region 123 within the N-drift regions 106, 107 respectively. The resulting N+ drain regions 122, 123 within N-drift regions 106, 107, depicted in FIG. 12, provide highly conductive implanted N+ drain contacts to the N-drift regions 106, 107. As discussed above, in an alternate embodiment, the N+ drain contacts 122, 123 can be implanted using the source mask which defines N+ source regions 114, 115. Next, P-body contacts are formed using a mask which leaves the P-body regions 110 of the low side FET 96 and the high side FET 98 uncovered. An etch is performed to remove exposed portions of the dielectric layer 116 and the N+ source regions 114, 115 as depicted in FIG. 12.

An optional shallow P-type implant can be performed to ensure that the regions exposed by the mask are doped to a P-type conductivity, for example in the event that an inadvertent under etch is performed which does not completely remove N+ source layers 114, 115 from over the P-body regions 110.

After etching the source regions 114, 115, the mask can be removed, then a self-aligned silicide (i.e. salicide) process can be performed to result in the FIG. 12 structure. FIG. 12 depicts silicide contacts 124 to the P-body regions 110 of both the low side FET 96 and the high side FET 98, as well as silicide contacts 126 to the drain region 122 of the low side FET 98 and to the drain region 123 of the high side FET 98. Even though the salicide 124, 126 can be formed during a single salicide process, the salicide structures 124 on the P-body regions 110 are numbered separately from the salicide structures 126 on the drain regions 122, 123 for descriptive clarity.

Figure 13:
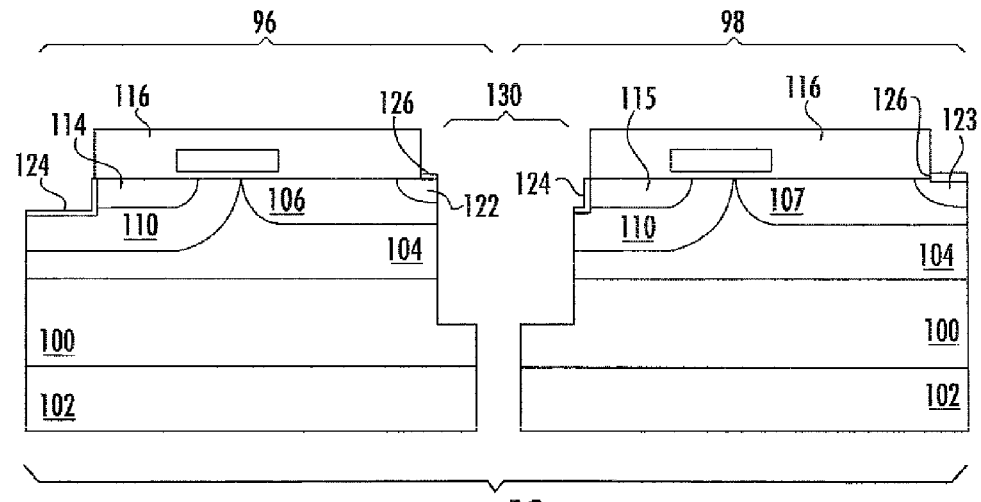

Next, a patterned deep trench etch is performed to result in the substrate trench 130 of FIG. 13. It should be noted that if the low side FET 96 and the high side FET 98 are being formed at locations which are remote from each other, the substrate trench 130 will include two trenches, one for the low side FET and one for the high side FET. If the two FETs are being formed adjacent to each other, the substrate trench 130 may be a single trench.

The trench can be etched deep enough to extend below the low side FET drain region 122, the low side FET N-drift region 106, the low side FET PBL 104, the high side source region 115, the high side FET P-body region 110, the high side FET PBL 104, and at least expose an N+ doped region within the epitaxial layer 100. The N+ doped region within the N-epitaxial layer results from outdiffusion of dopants from the N+ substrate 102 and into the N-type epitaxial layer 100. Further, the substrate trench 130 should be narrower than the silicide contact 124 to the high side FET 98 as well as the silicide contact 126 to the low side FET drain region 122. Additionally, this trench etch removes a portion of these silicide contacts 124, 126 and forms vertically oriented sidewalls in the silicide contacts 124, 126 as depicted in FIG. 13. An optional N+ implant (not depicted) into the trench bottom can be performed to function as a channel stop.

In an alternate embodiment, the substrate trench 130 is etched to a depth which is sufficient to expose the N+ doped semiconductor substrate 102.

As discussed above relative to FIGS. 3, 5, and 7, an implanted N+ isolation region can be formed within at least the low side FET substrate trench sidewall. In these embodiments, the trench sidewall is doped, for example using an angled N+ ion implantation into the low side trench sidewall. The N+ isolation prevents electrical contact between a subsequently formed trench conductor and the P-buried layer 104 of the low side device.

In an embodiment, performing the angled N+ implant into the low side FET trench sidewall but omitting the N+ implantation into the substrate trench sidewall of the high side FET can be advantageous. For example, omitting the N+ implant from the high side FET substrate trench sidewall can result in reduced process complexity because outdiffusion of dopants into the high side FET during subsequent anneal steps is avoided. The diffusion of N+ dopants into the high side device may reduce electrical performance resulting from the source of the high side FET being close to the substrate trench, while the source of the low side FET is at a location more removed from the substrate trench as depicted. As discussed previously, the implant can be performed into both substrate trench sidewalls (high side FET and low side FET) as depicted in FIG. 3.

Next, a dielectric such as oxide can deposited, for example to a thickness of about 0.1 μm, then anisotropically etched, for example using a spacer etch. This will result in dielectric spacers or liners 140 within the substrate trench 130 and also dielectric spacers or liners 144 covering other vertical surfaces such as the silicide contacts 124 as depicted in FIG. 14. The process to form dielectric liners 140 will provide the liners as depicted in the various embodiments of FIGS. 5-7, however this dielectric deposition is not performed form the embodiments depicted in FIGS. 3 and 4.

Subsequently, a blanket conductor such as titanium, tungsten, or polysilicon is filled within the trench and etched back or planarized to result in the FIG. 15 structure having a patterned trench conductor 150 and other conductive structures 152. The conductive layer 150, 152 can either be left above the level of the silicide contacts 126 as depicted in FIG. 15, or it can be etched back below the level of the silicide contacts 126 as depicted in FIG. 16. Etching back the conductive layer 150, 152 as depicted in FIG. 16 may have an advantage of permitting direct contact to the silicide contacts 126 after etching back the blanket dielectric which forms liners 144. However, in some cases, it may be desirable to omit an etch back of the trench conductive layer 150, 152 as it may damage silicide contacts 124, 126.

As depicted in FIG. 15, the dielectric liner 140 along a first trench sidewall on the side of the low side FET is interposed between trench conductor 150 and the P-buried layer 104 of the low side FET 96. Similarly, the dielectric liner 140 along a second trench sidewall on the side of the high side FET is interposed between the trench conductor 150 and the P-buried layer 104 of the high side FET.

In the FIG. 16 device, continuing with the process as described below may not result in electrical connection between the low side FET drain region 122 and the trench conductor 150. In the FIG. 16 embodiment, a self-aligned silicide (i.e. salicide) process can be used with a polysilicon trench fill to form silicide structures 160 to electrically connect low side FET drain region 122 with trench conductor 150, which would also form silicide structures 162, 164 and 166.

Figure 17:
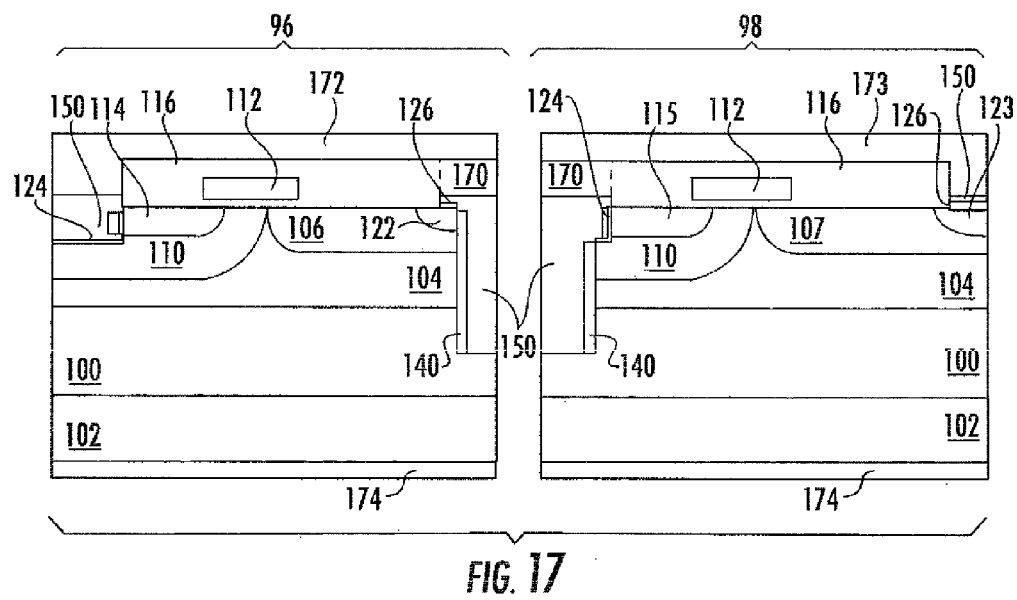

After forming the FIG. 15 structure (or, optionally, the FIG. 16 structure) wafer processing can continue to form a completed semiconductor device. This can include the formation of a dielectric layer 170 such as oxide to cover the trench conductor 150, a patterned conductive layer 172, 173, for example metal, over the dielectric layer 170, and a back side conductor 174 such as a metal layer as depicted in FIG. 17. The patterned conductive layer 172, which is depicted as overlying the transistor gate 112 of the low side FET 96, can be connected to a device ground ($P_{GND}$) pinout, which can be electrically connected to $P_{GND}$ during device operation. The patterned conductive layer 173, which is depicted as overlying the transistor gate 112 of the high side FET 98 can be connected to a voltage in ($V_{IN}$) pinout, which can be electrically connected to $V_{IN}$ during operation. In the embodiments of FIGS. 4 and 6, an intervening patterned dielectric etch would be performed to result in the stepped (graded) oxide as depicted in FIGS. 4 and 6. An optional passivation layer can be formed.

If the low side FET 96 and the high side FET 98 are formed at locations which are remote from each other, the N+ drain region 122 of the low side FET 96 (referring to FIG. 17, for example) is connected to the N+ source region 115 of the high side FET 98 through low side silicide contact 126, low side FET trench conductor 150, N-type epitaxial layer 100, high side trench conductor 150, and high side silicide source contact 124.

If the low side FET 96 and the high side FET 98 are formed adjacent to each other so that the trench conductor 150 for both devices is a single conductive structure, the N+ drain region 122 of the low side FET 96 (referring to FIG. 17, for example) is connected to the N+ source region 115 of the high side FET 98 through low side silicide contact 126, low side FET and high side FET trench conductor 150, and high side FET silicide source contact 124. In this embodiment, the trench conductor 150 is used to electrically connect with the back side of the device, and the conductive layer 174, to provide an output of the device as described below.

The back side conductor 174 can provide an output of the DC to DC power converter device provided by the low side FET 96 and the high side FET 98. The back side conductor 174 of FIG. 17 can thus provide the output (i.e. a phase or phase node) of the output stage provided by the low side FET 96 and the high side FET 98 of DC to DC power converter.

Thus the FIG. 17 device includes a front side (also referred to herein as "circuit side," and "upper surface") of the semiconductor wafer section having circuitry (e.g. transistor structures such as transistor gates 112) thereon, and a back side with a conductive layer 174 thereon. The back side is opposite the front side. The low side FET 96 and the high side FET 98 can both be provided by LDMOS transistor FETs. The device can include an output stage for a DC-DC power converter, with both low side LDMOS and high side LDMOS output devices on a single piece of semiconductor material such as silicon or gallium arsenide (e.g. on a single die). In an embodiment, patterned conductive layer 173 and thus the drain region 123 of the high side device 98 is electrically connected to device voltage in ($V_{IN}$) which is the voltage to be converted. Patterned conductive layer 172 and thus the source region 114 of the low side device 96 is tied to device ground ($P_{GND}$). An output of the output stage can be provided by conductive layer 174 on the back side of the device.

In the FIG. 17 device, the drain region 122 of the low side device 96 is electrically the same point as the source region 115 of the high side device 98, which provides an output node of the DC to DC power converter. The drain region 122 of the low side FET 96 (the output of the output device) is electrically connected to the back side (also referred to herein as "non-circuit side," "lower surface") of the semiconductor die on which the high side and low side FETs are formed. This connection to the output of the output device can be made using a physical connection through metal 150, and the semiconductor substrate 102. The physical connection can include a conductive path from the surface, through the N-type epitaxial layer 100, to reach the N+ semiconductor substrate 102. This conductive path can include a conductive structure such as the conductive trench conductor 150 as depicted. In another embodiment, a conductive structure such as an implanted diffusion region (i.e. a sinker) can be formed in place of the trench conductor. A sinker embodiment is described below with reference to FIGS. 21-32. The back side of the die, therefore, can provide a node for the output of the power device output stage, which can simplify electrical connections. Connection to the output stage, which can be provided by conductive layer 174, can be accomplished with a conductive die attach material, for example.

Figure 18:
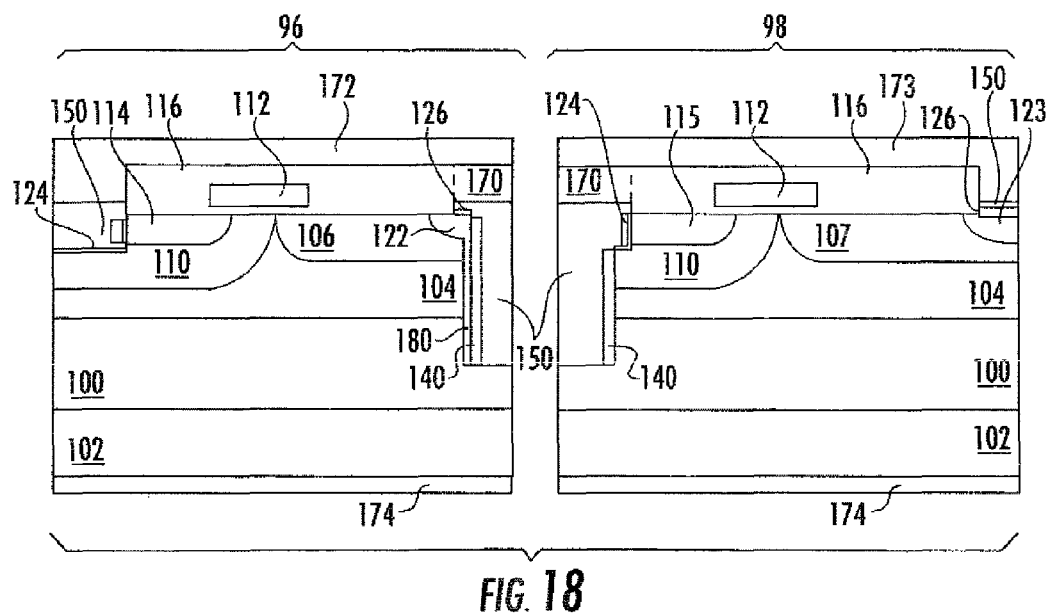
FIGS. 18-20 are cross sections of other embodiments of the present teachings.

FIG. 18 depicts an embodiment similar to that depicted in FIG. 17, including a first substrate trench sidewall on the side of the low side FET, and a second substrate trench sidewall on the side of the high side FET. A doped electrical isolation region 180 is implanted into the first substrate trench sidewall, but there is no corresponding doped region implanted into the second sidewall. Thus the implanted region 180 is interposed between the trench conductor 150 and the P-buried layer 104 of the low side FET 96, but there is no corresponding doped region interposed between the trench conductor 150 and the buried layer 110 of the high side FET 98.

The doped electrical isolation region 180 of FIG. 18 may electrically isolate the P-buried layer 104 of the low side FET 96 from the trench conductor 150 better than the dielectric spacer or line 140 alone. Thus this embodiment depicts both a dielectric spacer or liner 140 and a doped isolation region 180 on the sidewall of the low side FET 96, and only a dielectric spacer or liner 140 on the sidewall of the high side FET 98.

This embodiment can be formed using an angled N+ implant into the first sidewall but not the second sidewall, and thus there is no corresponding N+ region on the second sidewall. Omitting the N+ implant from the second sidewall can result in reduced process complexity because outdiffusion of dopants into the high side FET during subsequent anneal steps is avoided. The diffusion of N+ dopants into the high side device may reduce electrical performance resulting from the source region 115 of the high side FET 98 being close to the second sidewall of the substrate trench, while the source region 114 of the low side FET 96 is at a location more removed from the first sidewall of the substrate trench.

Figure 19:
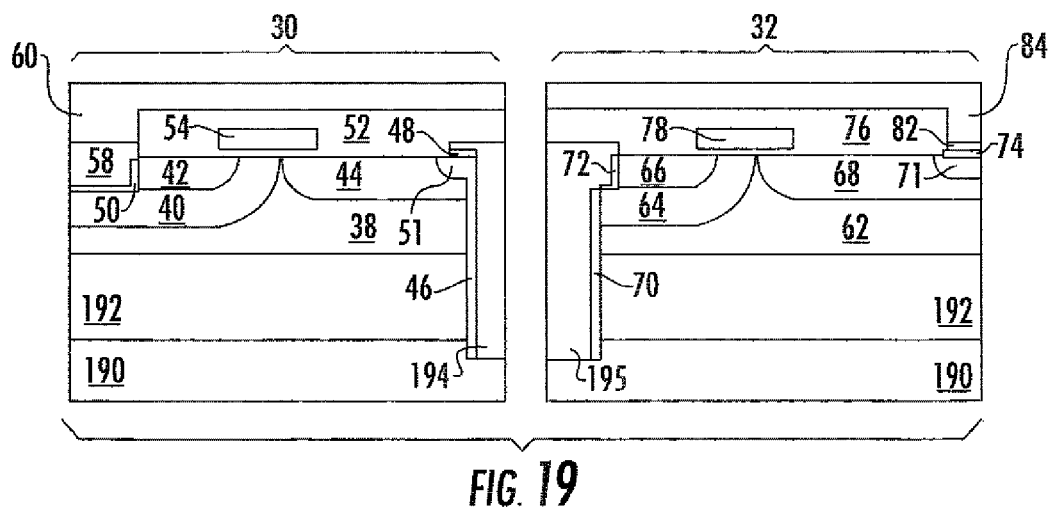

FIG. 19 depicts an N-channel LDMOS (N-LDMOS) device which can be formed according to a method of the present teachings. The FIG. 19 device includes elements which can be similar to those depicted in FIG. 3 and are similarly numbered. As discussed above, the FIG. 3 device can include an N+ semiconductor substrate 34 and an epitaxial layer 36 doped to a low doped N doping concentration, and is formed using a substrate trench etch which stops with a bottom in the epitaxial layer 36. The FIG. 19 device can include a semiconductor substrate 190 which is heavily doped with N-type dopants (i.e. doped to a N+ doping concentration), an epitaxial layer 192 which is low doped with P-type dopants (i.e. doped to a P doping concentration), and can be formed using a trench etch which stops with a bottom in the semiconductor substrate 190 so that the trench conductor 194, 195 contacts the N+ semiconductor substrate 190. The N+ semiconductor substrate can have a N-type doping concentration of about 1E18 to about 5E20 atoms/cm$^3$, and the P-type epitaxial layer can have a P-type doping concentration of about 1E16 to about 1E18 atoms/cm$^3$.

Thus the FIG. 19 device can provide a low side N-channel LDMOS device and a high side N-channel LDMOS device on a P+ semiconductor substrate and a P epitaxial layer. With this device, the N-type drain can form a PN junction. In N-channel device embodiments where the semiconductor substrate is N+ and the epitaxial layer is N doped, the drain forms an NPN junction which requires tighter process control because of resulting NPN parasitics to ensure that the robustness of the N-channel device is not reduced.

With prior embodiments, continuing the substrate trench etch so that the bottom of the substrate trench is within the semiconductor substrate provides for a low resistance contact between a trench conductor within the substrate trench and the semiconductor substrate 190. In most of the embodiments described above, the substrate trench can be etched to the depth of the P+ or N+ substrate to provide for a low resistance contact between the trench conductor and the semiconductor substrate. Depending on the thickness of various layers and the width of the substrate trench, however, there may be a limit on the depth of the trench. Thus other embodiments can stop within the P or N epitaxial layer with, for example, outdiffusion of dopants from the semiconductor substrate into the epitaxial layer enhancing conductivity.

Figure 20:
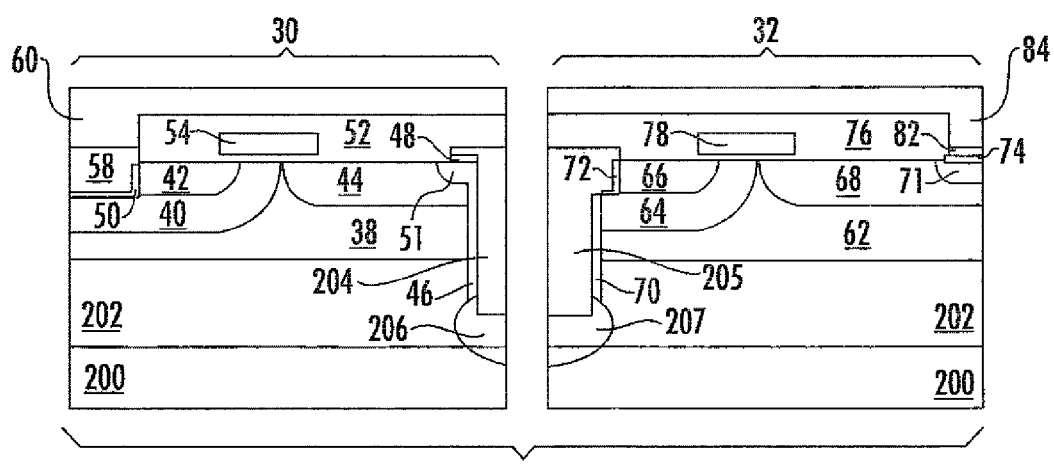

FIG. 20 depicts an embodiment including an N+ semiconductor substrate 200, a P doped epitaxial layer 202, a low side trench conductor 204 within the substrate trench, and a high side trench conductor 205 within the substrate trench. In this embodiment, the etch which forms the substrate trench stops within the epitaxial layer 202. To enhance conduction between the N+ semiconductor substrate and the trench conductor, the epitaxial layer at the bottom of the trench is implanted to an N+ doping level, for example with boron. The implant is then diffused to form a low side trench implant region 206 and a high side trench implant region 207 which extends from the bottom of the trench to the semiconductor substrate 200. In processes having, for example, a trench etch which requires a high aspect ratio, or to simplify the process by using a shallower trench etch which does not require etching down to the level of the semiconductor substrate 200, the bottom of the substrate trench can be implanted to reduce resistance (increase conduction) between the trench conductor 204, 205 and the semiconductor substrate 200.

It will be understood that a P-channel LDMOS device can be formed using dopant conductivities which are the opposite to those of FIGS. 19 and 20. In general, either an N-channel LDMOS FET or a P-channel LDMOS FET can be formed using any of the methods described herein using the specified dopant conductivities or their opposite conductivities.

Embodiments of the present teachings provide connection to the output of the output stage of the device using a conductive layer on the back side of the semiconductor substrate. Benefits of using the back side of the die to connect with the device output stage, and benefits of monolithically combining the high side FET and the low side FET on one die, can include: reduced packaging challenges since there is no need to connect the output node on top of the die; reduced cost since there is no need to attach one or more bond wires or copper clips to connect the output, which can be accomplished by the present teachings through the use of a standard lead frame and conductive die attach material; interconnecting the low side FET and the high side FET improves performance by eliminating parasitic inductances which can cause ringing, loss in efficiency, reduced reliability, higher temperatures, etc.; and LDMOS devices can be used for higher frequency response than other approaches, since LDMOS devices can achieve low gate charge and improved $RDS_{ON}$*Charge figures of merit.

An embodiment thus can include a high side LDMOS device with its source connected to the substrate, a low side LDMOS device with its drain connected to the substrate using the same trench on the same wafer. The source of the high side LDMOS device is thus the same node as the drain of the low side device.

Embodiments of the present teachings can use a minimum of six masks, and up to 11 masks, depending on the process. These masks can include the following: 1) mask to form the active region; 2) optional mask to form the P-buried layer regions (which can be isolated from each other across low side and high side devices using the trench); 3) optional mask to form the N-drift regions for both devices, which may not be needed if drift region is only formed in region defined by active; 4) gate layer mask; 5) optional P-body mask, which may not be needed in a local oxidation of silicon (LOCOS) process, which can use the field oxide and gate layers to block the implant; 6) optional N+ mask which may not be needed in a LOCOS process, which would use the field oxide and gate layers to block the implant; 7) a body contact mask; 8) a drain contact mask; 9) a deep trench etch mask; 10) a metal mask, and; 11) an optional pad (passivation) mask.

An exemplary 11 mask process is depicted in FIGS. 21-33. Optional masks and process variations will be described such that processes using a different number of masks can be implemented by one of ordinary skill in the art from the description herein.

Figure 21:
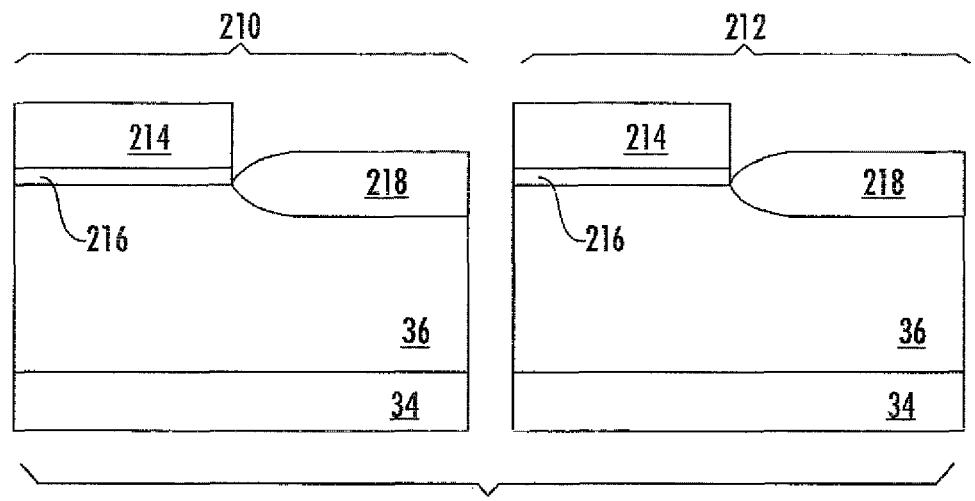
FIGS. 21-32 are cross sections of other embodiments of the present teachings.
Figure 22:
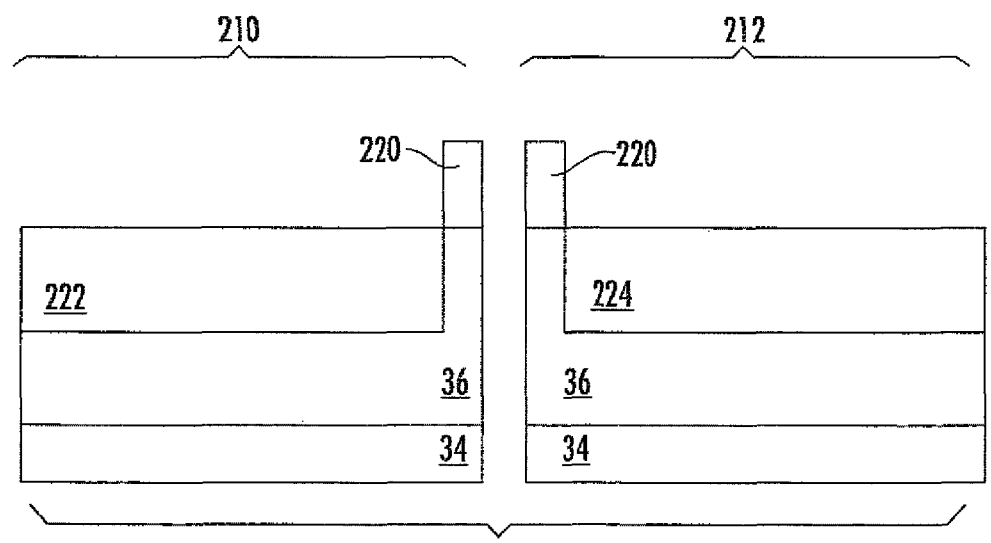

FIG. 21 depicts a first stage in a process which can be used to form a low side FET 210 and a high side FET 212. The FIG. 21 structure includes an N+ semiconductor substrate 34 and an N-type epitaxial layer 36 which can be formed according to the techniques described above. A patterned first mask 214 (active mask) can be used to pattern a dielectric layer 216, for example silicon nitride. After dielectric layer 216 is patterned, first mask 214 can be removed and the epitaxial layer 38 is oxidized at exposed locations to form field oxide 218 at non-active area locations, for example using a LOCOS process. It should be noted that first mask 214 will typically be removed prior to oxidation of the epitaxial layer 38 to form field oxide 218, however both field oxide 218 and first mask 214 are depicted in FIG. 21 for purposes of explanation.

The first mask 214 which defines the active area is optional. If used, the field oxide 218 will be formed at future N-drift regions of the low side FET 210 and the high side FET 212. The field oxide can improve isolation between devices and can reduce mask count as described below. However, the field oxide can result in an uneven surface which can lead to processing complexities as known in the art. The method described below continues for a device where the active area mask is not used during processing.

After defining the active regions, a patterned second mask 220 (P-buried layer mask) can be formed to define separate P-buried layer regions for the low side device 210 and the high side device 212. A P-type implant is performed to form a P-buried layer 222 for the low side FET 210 and a P-buried layer 224 for the high side FET 212. The same implant can be used to form both P-buried layers 222, 224.

In an alternate embodiment, the second mask is omitted and a blanket P-buried layer implant can be performed to form a continuous P-buried layer over within the epitaxial layer 38. The PBL blanket implant may be sufficient if the P-buried layers 38, 62 for the low side FET 210 and the high side FET 212 are sufficiently separated by a substrate trench etch or a sinker implant (described below). If the sinker implant does not counterdope the P-buried layer sufficiently, the second patterned mask 220 can be used to form discontinuous P-buried layers 222, 224 as depicted.

Figure 23:
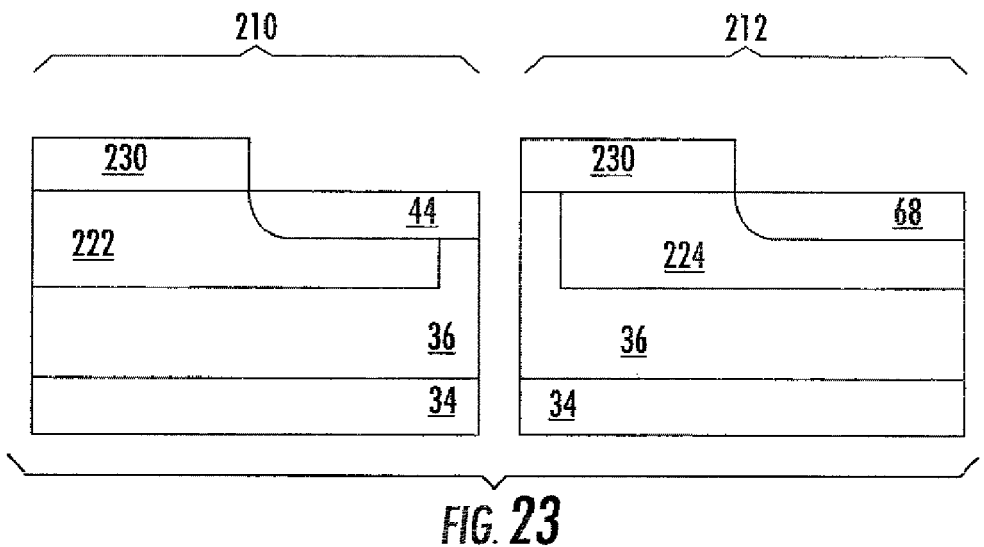

Next, as depicted in FIG. 23, a patterned third mask 230 (N-drift mask) is formed to define the N-drift regions 44, 68. In an alternate process, this mask is omitted and a blanket N-drift implant is performed into the upper surface of the epitaxial layer 36. In the blanket N-drift embodiment, a portion of the N-type region will be sufficiently counterdoped with the P-type P-body implant, such that the P-body region has a net P-type conductivity and thus the N-drift mask can be omitted.

Figure 24:
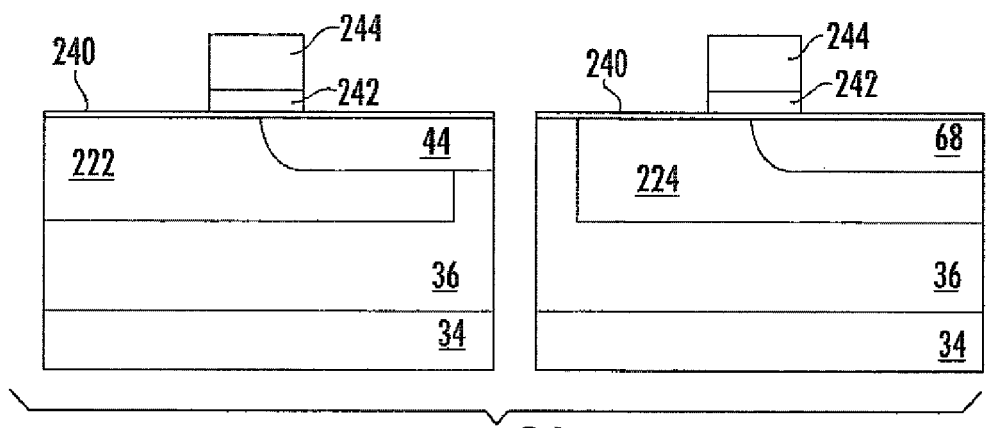

The FIG. 24 structure includes a gate dielectric 240, patterned transistor gates 242 for the low side FET 210 and the high side FET 212, and a patterned fourth mask 244 (gate mask). To form the FIG. 24 structure, a blanket gate dielectric, a blanket gate layer, and a patterned fourth mask are formed on the FIG. 23 structure. The blanket gate layer is patterned using the forth mask to result in the FIG. 24 structure.

Figure 25:
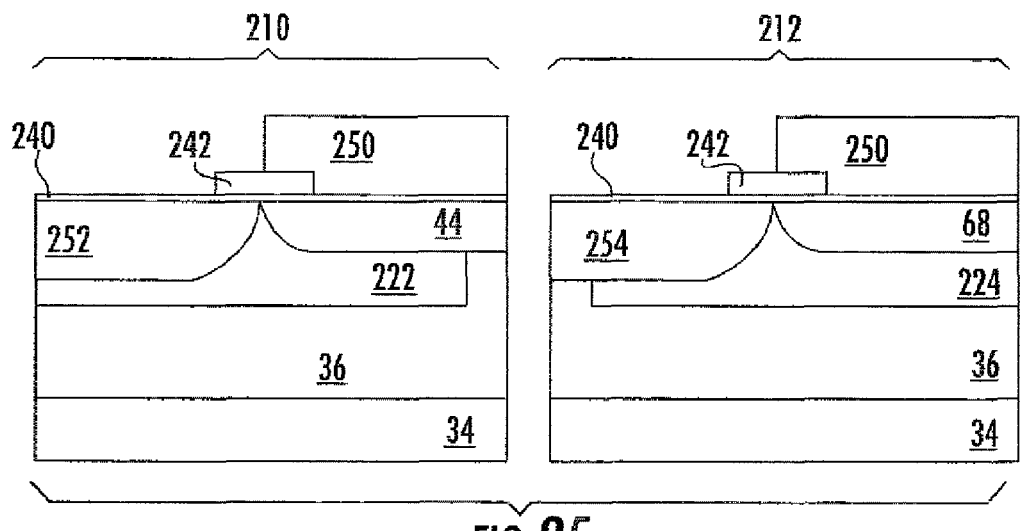

Next, the fourth mask 244 is removed and a patterned fifth mask 250 (P-body mask) is formed over the low side FET 210 and the high side FET 212 as depicted in FIG. 25. A P-type implant is performed to result in low side FET P-body region 252 and high side FET P-body region 254. If the N-drift region was formed as a blanket region, this P-body implant will counterdope the N-drift region. This fifth mask 250 can use a portion of the gates 242 to block the implant and thus has some processing leeway. After implanting P-body regions 252, the fifth mask 250 is removed an a diffusion process can be performed to diffuse the P-body regions 252, 254 under the transistor gates 242. The P-body mask 250 is optional, and may not needed if the field oxide 218 of FIG. 21 is used which, along with the transistor gates, will block the P-body implant from the N-drift regions.

Figure 26:
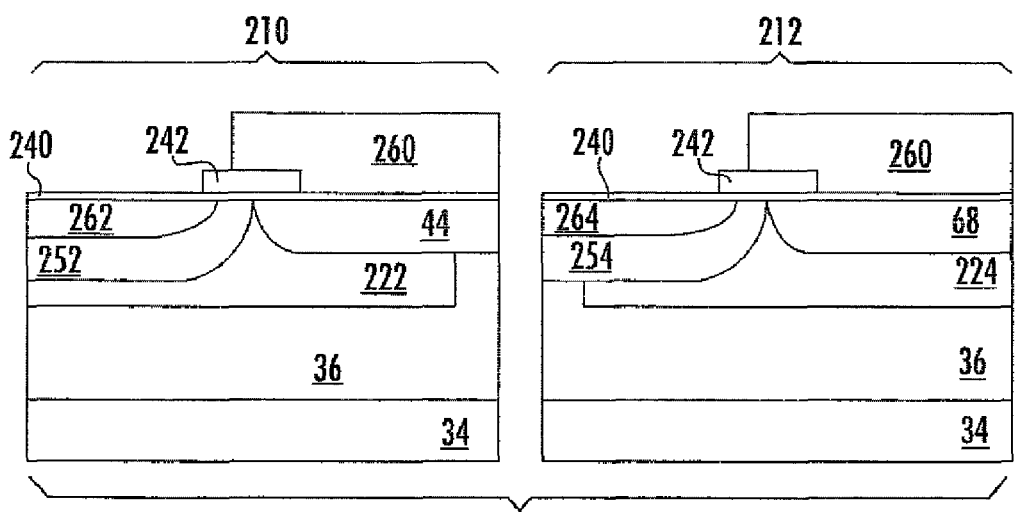

Subsequently, a patterned sixth mask 260 (source mask) can be formed as depicted in FIG. 26 to define the N+ source regions for both devices. An N-type implant provides a source region 262 for the low side FET 210 and a source region 264 for the high side FET 212. The source mask 260 is optional, and may not needed if the field oxide 218 of FIG. 21 is used which, along with the transistor gates, will block the source implant from the N-drift regions. After implanting the source regions 262, 264, the sixth mask 260 is removed.

Figure 27:
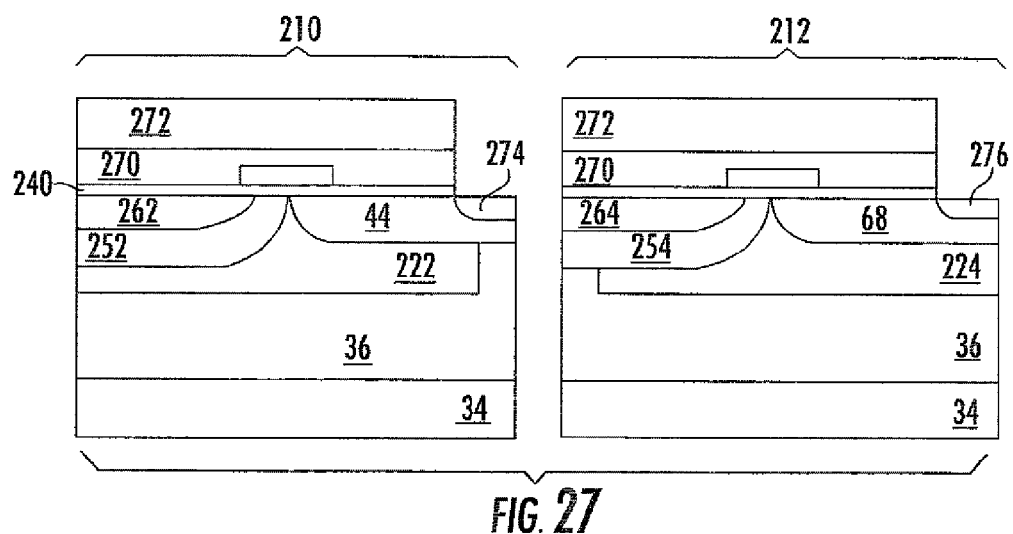

Next, as depicted in FIG. 27, a blanket interlevel dielectric (ILD) layer 270 is formed, and a patterned seventh mask 272 (drain region or drain contact mask) is formed. Exposed portions of the ILD layer 270 and the gate dielectric 240 are etched to expose a portion of the N-drift regions 44, 68. An N+ implant into the N-drift regions 44, 68 is performed to provide low side FET drain region 274 and high side FET drain region 276. After implanting the N+ drain regions 274, 276, the seventh mask 272 is removed.

Figure 28:
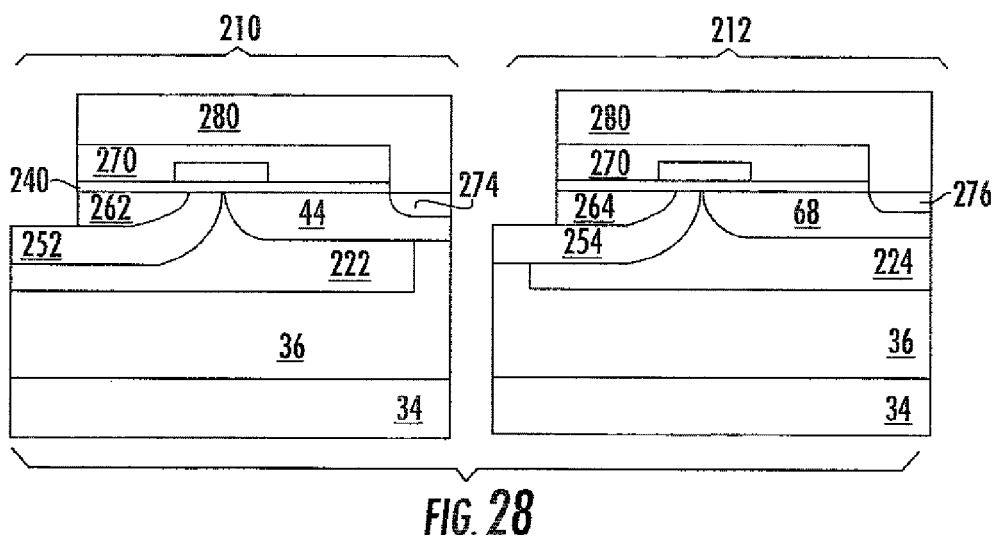
Figure 29:
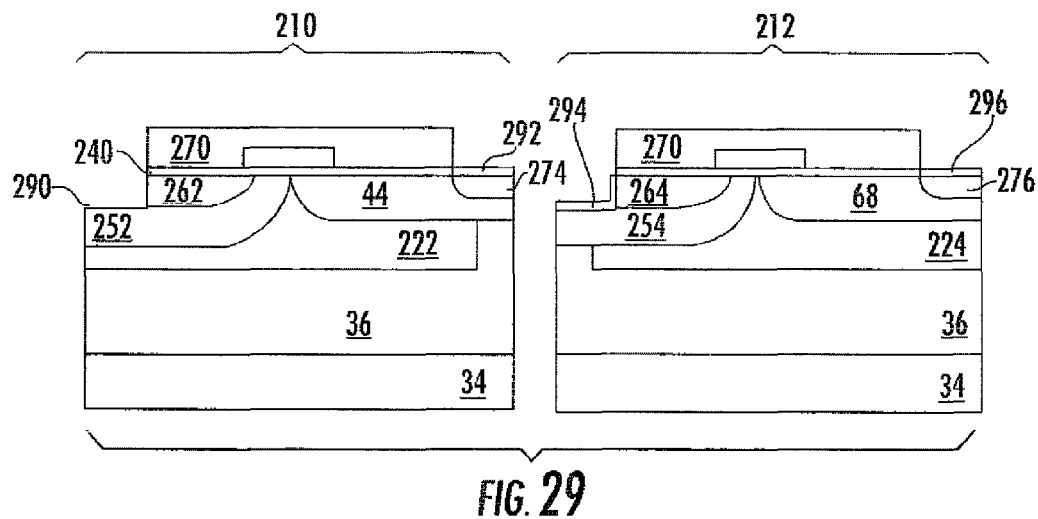

Subsequently, a patterned eighth mask 280 (body contact mask) is formed as depicted in FIG. 28 which will define contact openings to P-body regions 252, 254, and will expose source regions 262, 264, After forming body contact mask 280, exposed portions of the ILD layer 270, the gate dielectric 240, and the source regions 262, 264 are etched to expose the P-body regions 252, 254. The etch forms vertically oriented sidewalls of the source regions 262, 264 as depicted. The etch may continue to etch slightly into the P-body regions 252, 254. Additionally, a P-type implant can be performed in the case that an under etch fails to expose the P-body regions 252, 254, which will ensure P-type contact to the P-body regions 252, 254. After exposing the P-body regions 252, 254, the eighth mask 280 is removed.

It will be apparent that the order of the P-body contact mask 280 and the drain region mask 270 can be reversed.

After removing the eighth mask, a self-aligned silicide (salicide) process is performed according to techniques known in the art to result in silicide structures 290, 292, 294, 296. Silicide 290 is formed to electrically connect the P-body region 252 to the source region 262 of the low side FET 210, and silicide 292 contacts the drain region 274 of the low side FET 210. Silicide 294 is formed to electrically connect the P-body region 254 of the high side FET 212 to the source region of the high side FET 212, and silicide 296 contacts the drain region 276 of the high side FET 212.

Figure 30:
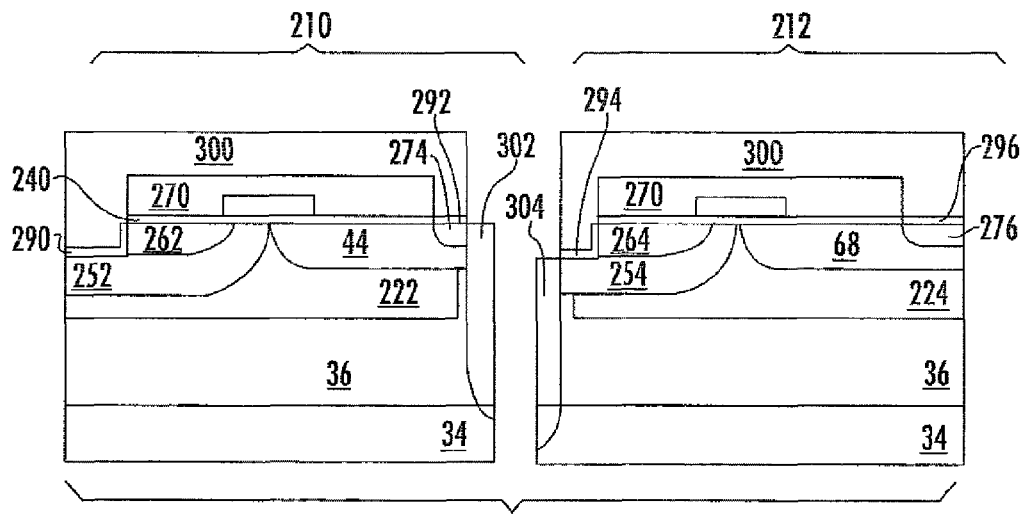

Subsequently, a patterned ninth mask 300 (sinker mask) is formed as depicted in FIG. 30. A silicide etch is performed to etch any exposed salicide 292, 294, then an N+ implant is performed as depicted to form an N+ implanted (doped) sinker region 302 for the low side FET 210 and an N+ implanted (doped) sinker region 304 for the high side FET 212. Sinker region 302 electrically couples the low side FET 210 drain region 274 with the N+ semiconductor substrate 34. Sinker region 304 electrically couples the high side FET 212 source region 264 and P-body region 254 with the N+ semiconductor substrate 34. Thus the drain region 274 of the low side FET 210 is electrically coupled with the source region 264 of the high side FET 212 through the sinker regions 302, 304, the semiconductor substrate 34, and the silicide 294. After etching exposed silicide 292, 294 and implanting sinker regions 302, 304, the sinker mask 300 is removed.

The silicide 294 further electrically couples the source region 264 to the P-body region 254. It will be realized that the sinker 304 may diffuse under silicide 294 during subsequent processing, which will enhance conduction between both the high side FET source region 264 and the P-body region 264 with the sinker region 304 due to a larger contact surface area. However, the diffusion of region 304 should not extend beyond the sidewall of source region 264 so that contact between the high side FET P-body region 254 and the sinker 304 can be maintained.

Additionally, the sinker regions 302, 304 can have a different profile and/or a different scale than the embodiment depicted in FIG. 30.

Figure 31:
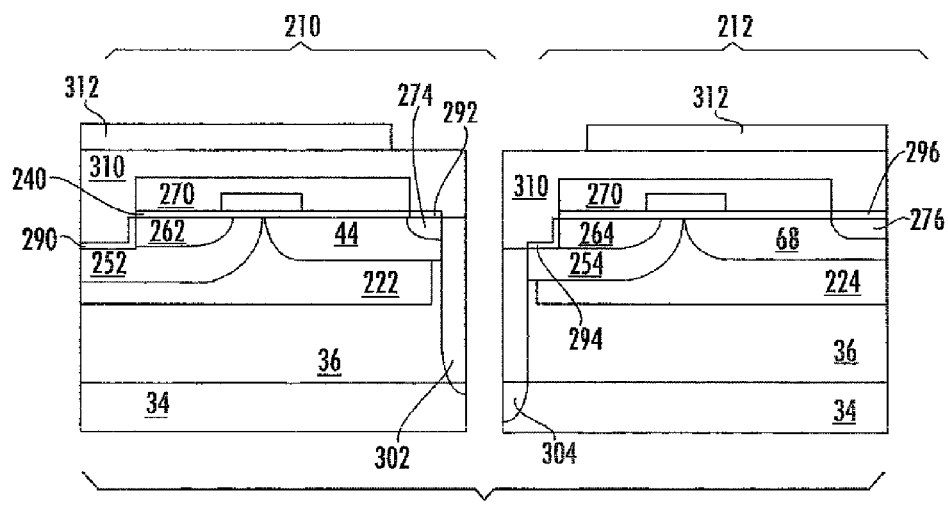

After forming the FIG. 30 structure and removing sinker mask 300, a blanket metal layer 310 and a patterned tenth mask 312 (metal mask) can be formed as depicted in FIG. 31. In particular, the metal layer 310 contacts silicide 290 to make electrical contact with the low side FET source 262 and P-body region 252, and with silicide 296 to make electrical contact with the high side drain 276. After forming the FIG. 31 structure, an etch is performed to remove exposed portions of the metal layer 310, in particular the portion of metal layer 310 over the sinker region 302, 304, while leaving silicide 292, 294. Subsequently, the patterned tenth mask 312 is removed.

Figure 32:
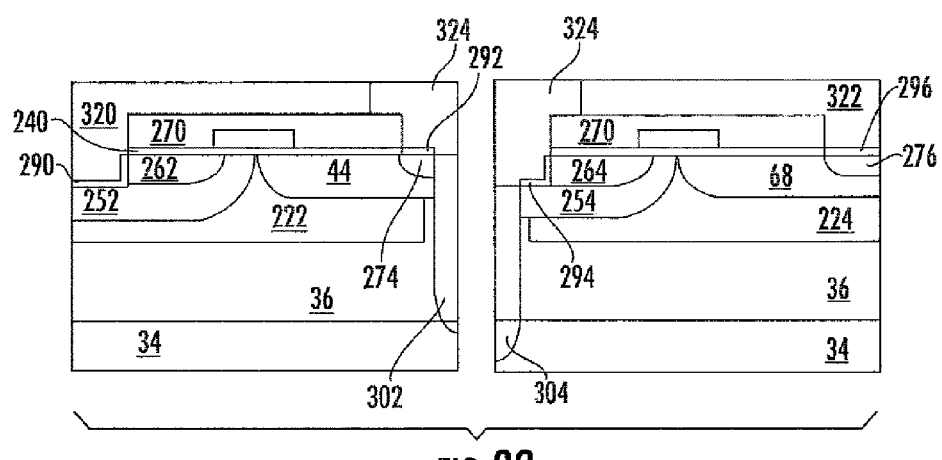
Figure 33:
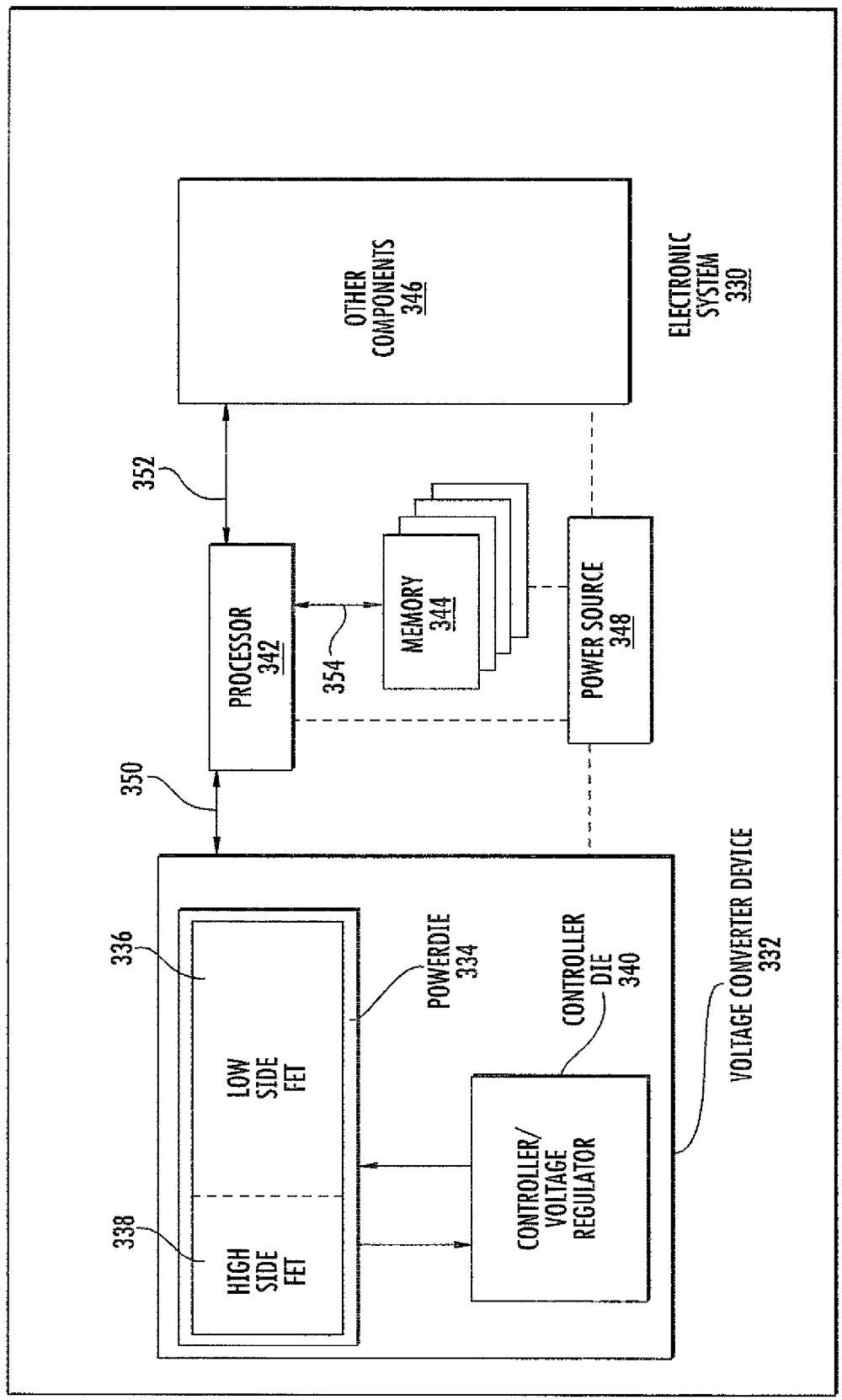
FIG. 33 is a block diagram of an electronic system which can be formed according to an embodiment of the present teachings.

The etch of metal layer 310 results in a first metal layer portion 320 which contacts the low side FET 210 source region 262 and P-body region 252, and a second metal layer portion 322 which contacts the high side FET 212 drain region 276 as depicted in FIG. 32. After removing the metal mask 312 of FIG. 32, a blanket dielectric layer is formed and planarized, for example using CMP, to result in dielectric 324 as depicted in FIG. 32.

After forming the FIG. 32 structure, a passivation layer can be formed an patterned using a patterned eleventh mask in accordance with known techniques. Because passivation layers are well known in the art, and because the area depicted in FIG. 32 will typically be clear of any passivation, the passivation layer and mask is not depicted.

By reviewing the process depicted in FIGS. 21-32 and the accompanying text, it will be appreciated that a six mask flow embodiment can include the following mask layers:

1) A mask to form the active region. This mask will be used to pattern a layer of silicon nitride. P-buried layer regions will be created using an MeV implant. Alternately, the P-buried layer can be created using a blanket implant prior to forming the first mask, or the P-buried layer can be created using an epitaxial layer deposition. N-drift regions for both devices are implanted in the region opened using active mask. Thick oxide is grown in the region where nitride is removed using active mask.

2) A gate layer mask. The gate metal (or polysilicon) is patterned using this mask. The P-body region is implanted using a low energy implant. No mask is needed as field oxide and gate layers will block the P-body implant from appropriate regions. An N+ layer is implanted using a low energy implant. Again, no mask is needed as field oxide and gate layers will block the implant in appropriate regions. Oxide is deposited to cover the gate metal.

3) A body contact mask is used to open the region where the body contact will be formed. Oxide, as well as silicon, is etched in the exposed region. The depth of the silicon etch is larger than the N+ junction depth. N+ is exposed on the sidewall, and the P-body region is exposed on the bottom of body contact. An optional P+ implant can be performed to increase the doping of the bottom P-region.

4) A drain contact mask is used to open the region for a drain contact. An N+ implant is performed, and an optional silicide process can be used to create metal silicide in body contact and drain contact regions.

5) A deep trench etch mask is used to open a deep trench from the top surface to below the heavily doped N-region. This trench should be deeper than the P-buried layer, and is preferably more than the combined thickness of all epitaxial layers. The order of the drain contact mask and the deep trench etch mask can be varied.

6) A metal mask is then used to pattern subsequent metallization.

It is also contemplated that a process which does not use a mask to form the active layer can be used. This process will have improved performance, but may require additional layers. In this process, a minimum of 8 and a maximum of 10 masks can be specified. The masks for a process without active can include: 1) an optional mask to implant the P-body regions, which may not be needed as the P-body regions can be isolated from each other using the trench; 2) a mask to define the N-drift regions; 3) a mask to define the gates; 4) a mask to expose the P-body regions; 5) a mask to define the N+ regions for the drain contacts; 6) a mask to etch the P-body region; 7) a mask to form the drain contacts; 8) a mask for the trench; 9) a mask for the metal, and; 10) an optional pad (passivation) mask.

Further, in some embodiments, a mask to form the P-buried layer may be omitted because both the low side and high side devices include the P-buried layer. A P-well created during the formation of the P-buried layer can be separated during the trench etch to support isolated operation of the two devices. In an embodiment, the P-buried layer can be a separate epitaxial layer, thus omitting the need for a high energy implant.

A high side LDMOS device and a low side LDMOS device can be formed on a single semiconductor die to provide a PowerDie. In an embodiment, the PowerDie can be packaged or encased together with a separate semiconductor die including voltage converter controller circuitry which is electrically coupled with the PowerDie to provide a DC to DC converter.

Thus the PowerDie with the low side transistor and the high side transistor are located in the same device package as the controller circuitry.

A voltage converter device in accordance with the present teachings may be attached along with other semiconductor devices such as one or more microprocessors to a printed circuit board, for example to a computer motherboard, for use as part of an electronic system such as a personal computer, a minicomputer, a mainframe, or another electronic system. A particular embodiment of an electronic system 330 is depicted in the block diagram of FIG. 33. The electronic system 330 can include a voltage converter device 332 such as one according to the present teachings. The voltage converter device 332 can include a first die (a PowerDie) 334 having a low side LDMOS FET 336 and a high side LDMOS FET 338 on the same semiconductor substrate, and a second die (controller die) 340 which can include a controller/voltage regulator. The electronic system can further include a processor 342 which may be one or more of a microprocessor, microcontroller, embedded processor, digital signal processor, or a combination of two or more of the foregoing. Electronic system 330 can further include one or more memory devices such as static random access memory, dynamic random access memory, read only memory, flash memory, or a combination of two or more of the foregoing. Other components 346 can also be included, which will vary with the type of electronic device. The voltage converter device 332, processor 342, memory 344, and other components 346 can be powered by a power source (power supply) 348, which may be a converted AC power source or a DC power source such as a DC power supply or battery. The processor 342 can be electrically coupled to, and communicate with, the voltage converter device 332 through at least one first data bus 350, the memory through at least one second data bus 354, and the other components 346 through at least one third data bus 352. Thus electronic system 330 may be a device related to telecommunications, the automobile industry, semiconductor test and manufacturing equipment, consumer electronics, or virtually any piece of consumer or industrial electronic equipment.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

The invention claimed is:

1. A semiconductor device, comprising:
   a semiconductor die comprising a circuit side and a non-circuit side;
   a high side lateral diffusion metal oxide semiconductor (LDMOS) field effect transistor (FET) on the circuit side of the semiconductor die;
   a source region of the high side LDMOS FET;
   a low side LDMOS FET on the circuit side of the semiconductor die, wherein each of the corresponding structures of the high side LDMOS FET and the low side LDMOS FET have the same dopant type;
   a buried layer that extends through the high side LDMOS FET and the low side LDMOS FET;
   a conductive structure which electrically couples a drain region of the low side LDMOS FET with the source region of the high side LDMOS FET; and
   an output node, wherein the output node is electrically connected to the source region of the high side LDMOS FET and to the drain region of the low side LDMOS FET;
   wherein the conductive structure includes an isolating material disposed within the conductive structure and along at least one sidewall of the conductive structure.

2. The semiconductor device of claim 1, wherein the output node is electrically connected to the non-circuit side of the semiconductor die; the drain region of the low side LDMOS FET is electrically connected to the non-circuit side of the semiconductor die; and the source region of the high side LDMOS FET is electrically connected to the non-circuit side of the semiconductor die.

3. The semiconductor device of claim 1, further comprising:
a body region of the high side LDMOS FET; and
a body region of the low side LDMOS FET, wherein the body region of the high side LDMOS FET and the body region of the low side LDMOS FET are provided by a single implanted region.

4. The semiconductor device of claim 1, wherein the conductive structure comprises:
a substrate trench within an epitaxial layer of the semiconductor die; and
a trench conductor within the substrate trench, wherein the trench conductor electrically connects the source region of the high side LDMOS FET and the drain region of the low side LDMOS FET to a semiconductor substrate of the semiconductor die.

5. The semiconductor device of claim 4, wherein the trench conductor within the substrate trench is electrically connected to the non-circuit side of the semiconductor die.

6. The semiconductor device of claim 5, wherein the isolating material comprises an electrical isolation region electrically isolating the buried layer of the low side LDMOS FET from the trench conductor, wherein the electrical isolation region is at least one of a doped region and a dielectric spacer or liner.

7. The semiconductor device of claim 6, wherein the electrical isolation region is a doped region interposed between the trench conductor and the buried layer of the low side LDMOS FET, wherein there is no corresponding doped region interposed between the trench conductor and a buried layer of the high side LDMOS FET.

8. The semiconductor device of claim 1, wherein the conductive structure further comprises:
a doped sinker region within the semiconductor die, wherein the doped sinker region electrically couples the source region of the high side LDMOS FET and the drain region of the low side LDMOS FET to a semiconductor substrate of the semiconductor die.

9. The semiconductor device of claim 1, wherein the semiconductor die is a first semiconductor die and the semiconductor device voltage converter further comprises:
a second semiconductor die different from the first semiconductor die comprising voltage converter controller circuitry electrically coupled with the output node on the first semiconductor die.

10. The semiconductor device of claim 9, further comprising the first semiconductor die and the second semiconductor die being within a single semiconductor device package.

11. A semiconductor device, comprising:
a semiconductor die, comprising:
a single semiconductor substrate;
a low side transistor formed over the single semiconductor substrate and comprising a source region, a drain region, and a transistor gate;
a high side transistor formed over the single semiconductor substrate and comprising a source region, a drain region, and a transistor gate, wherein the high side transistor is formed from the same dopant implants and/or layers as the low side transistor;
a doped buried layer extending through the low side transistor and the high side transistor;
at least one conductive structure within the semiconductor die, wherein one or more of the at least one conductive structures couples the drain region of the low side transistor with the substrate; one or more of the at least one conductive structures coupling the source region of the high side transistor with the substrate;
an isolating material disposed within the at least one conductive structure and along at least one sidewall of the at least one conductive structure;
the drain region of the low side transistor is electrically coupled to the source region of the high side transistor through at least the at least one conductive structure;
the drain region of the high side transistor is electrically connected to a device voltage in (VIN) pinout; and
the source region of the low side transistor is electrically connected to a device ground (PGND) pinout.

12. The semiconductor device of claim 11, further comprising:
an epitaxial layer on a front side of the semiconductor substrate; and
a conductive layer on a back side of the semiconductor substrate, wherein an output of the semiconductor device voltage converter is provided by the conductive layer on the back side of the semiconductor substrate.

13. The semiconductor device of claim 11,
wherein the conductive structure comprises a substrate trench and a trench conductor within the trench; and
wherein the isolating material comprises an isolation region along a substrate trench sidewall of the substrate trench, wherein the isolation region prevents electrical contact between the trench conductor and the doped buried layer of the low side transistor.

14. The semiconductor device of claim 13, wherein the trench sidewall is a first trench sidewall interposed between the trench conductor and the buried layer of the low side transistor; the voltage converter device further comprising:
a second trench sidewall interposed between the trench conductor and the buried layer of the high side transistor;
wherein the isolation region comprises a doped isolation region within the first trench sidewall.

15. The semiconductor device of claim 14, wherein the second trench sidewall comprises no corresponding doped isolation region.

16. The semiconductor device of claim 11, wherein the conductive structure comprises a substrate trench and a trench conductor within the trench, the substrate trench having a first trench sidewall interposed between the trench conductor and the buried layer of the low side transistor;
and
a second trench sidewall interposed between the trench conductor and the buried layer of the high side transistor;
wherein the isolating material comprises a first dielectric spacer or liner on the first trench sidewall; and a second dielectric spacer or liner on the second trench sidewall, wherein the second dielectric spacer is interposed between the trench conductor and the buried layer of the high side transistor.

17. The semiconductor device of claim 11, wherein the conductive structure comprises a doped sinker region within the semiconductor die.

18. The semiconductor device of claim 11, wherein the low side transistor is a lateral diffusion metal oxide semiconductor (LDMOS) transistor; and the high side transistor is an LDMOS transistor.

19. The semiconductor device of claim 11, wherein the semiconductor die is a first semiconductor die and the voltage converter device further comprises:
a second semiconductor die comprising voltage converter controller circuitry thereon; and wherein the first semiconductor die and the second semiconductor die are within a single semiconductor device package.

20. The semiconductor device of claim 11, further comprising:
an epitaxial layer on a front side of the semiconductor substrate; wherein the semiconductor substrate comprises a first concentration of a dopant having a first conductivity; the epitaxial layer comprises a second concentration of a dopant having the first conductivity; the source region and the drain region of the low side transistor comprises a concentration of the dopant having the first conductivity; and the source region and the drain region of the high side transistor comprises a concentration of the dopant having the first conductivity.

21. An electronic system comprising:
a semiconductor device, comprising:
a high side lateral diffusion metal oxide semiconductor (LDMOS) field effect transistor (FET) and a low side LDMOS FET, each formed on the same semiconductor substrate and being a duplicate of one another, wherein a drain region of the low side LDMOS FET is electrically coupled with a source region of the high side LDMOS FET through the semiconductor substrate;
a buried layer which extends through the high side LDMOS FET and the low side LDMOS FET;
a conductive structure disposed through the buried layer to the semiconductor substrate, the conductive structure including an isolating material located within the conductive structure and along at least one sidewall of the conductive structure; and
an output node electrically connected to the source region of the high side LDMOS FET and to the drain region of the low side LDMOS FET;
the electronic system further comprising:
a processor electrically coupled to the voltage converter device through a first data bus;
memory electrically coupled to the processor through a second data bus; and
a power source which powers the voltage converter device, the processor, and the memory.

* * * * *